(12) United States Patent
Melanson et al.

(10) Patent No.: US 7,408,490 B2
(45) Date of Patent: Aug. 5, 2008

(54) CALIBRATION OF A REDUNDANT NUMBER SYSTEM SUCCESSIVE APPROXIMATION ANALOG-TO-DIGITAL CONVERTER

(75) Inventors: John L. Melanson, Austin, TX (US); Clinton R. Wolff, Westminster, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/537,872

(22) Filed: Oct. 2, 2006

(65) Prior Publication Data

US 2007/0075884 A1    Apr. 5, 2007

Related U.S. Application Data

(60) Provisional application No. 60/722,275, filed on Sep. 30, 2005.

(51) Int. Cl.
 *H03M 1/10* (2006.01)
(52) U.S. Cl. .................. 341/120; 341/155; 341/161
(58) Field of Classification Search ............. 341/155, 341/120, 172, 118, 119, 121, 161
 See application file for complete search history.

(56) References Cited

U.S. PATENT DOCUMENTS

| | | | | |
|---|---|---|---|---|
| 4,336,526 | A | | 6/1982 | Weir ............... 340/347 |
| 4,709,225 | A | * | 11/1987 | Welland et al. ....... 341/121 |
| 4,851,838 | A | | 7/1989 | Shier ................ 341/121 |
| 4,970,514 | A | | 11/1990 | Draxelmayr .......... 341/120 |
| 5,331,321 | A | | 7/1994 | Mannonen ........... 341/110 |
| 5,644,308 | A | | 7/1997 | Kerth et al. ......... 341/120 |

(Continued)

FOREIGN PATENT DOCUMENTS

EP    1339169 A1    8/2003

OTHER PUBLICATIONS

Muñoz et al., U.S. Appl. No. 09/394,809, filed Sep. 9, 1999, entitled "Memory and Accumulation Methods and Systems for Calibration and Conversion with Digital-to-Analog Converter (DAC) Elements in an Analog-to-Digital (A/D) Converter".

(Continued)

*Primary Examiner*—Brian Young
(74) *Attorney, Agent, or Firm*—Hamilton & Terrile, LLP; Kent B. Chambers

(57) ABSTRACT

A system and method calibrate a redundant number system analog-to-digital converter (RNS ADC) using successive approximations of multiple input signals and approximating each input signal at least twice. The RNS ADC includes N analog converter reference elements, each of the analog converter reference elements is associated with a weight in a weight vector $\overline{W}$, and N is an integer greater than one. The system and method successively approximate each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$, wherein M is a positive integer. The system and method utilize differences between the successive approximation converter reference element vectors, $\overline{C}_{1_j}$ and $\overline{C}_{2_j}$, to determine a final weight vector $\overline{W}_B$. Thus, in at least one embodiment, the difference between $\overline{C}_{1_j} \cdot \overline{W}_B$ and $\overline{C}_{2_j} \cdot \overline{W}_B$ can be used to determine the final weight vector $\overline{W}_B$.

58 Claims, 17 Drawing Sheets

U.S. PATENT DOCUMENTS

| | | | | |
|---|---|---|---|---|
| 5,675,340 | A | 10/1997 | Hester et al. | 341/156 |
| 6,252,454 | B1 | 6/2001 | Thompson et al. | 330/9 |
| 6,292,125 | B1 | 9/2001 | Conroy | 341/153 |
| 6,348,885 | B1 * | 2/2002 | Munoz et al. | 341/120 |
| 6,404,375 | B1 | 6/2002 | Muñoz et al. | 341/172 |
| 6,417,794 | B1 | 7/2002 | Muñoz et al. | 341/161 |
| 6,424,276 | B1 | 7/2002 | Muñoz et al. | 341/120 |
| 6,486,806 | B1 | 11/2002 | Muñoz et al. | 341/120 |
| 6,529,149 | B1 | 3/2003 | Karanicolas | 341/120 |
| 6,720,896 | B2 * | 4/2004 | Semmler et al. | 341/120 |
| 6,844,840 | B1 | 1/2005 | Melanson | 341/161 |
| 6,956,512 | B1 * | 10/2005 | San et al. | 341/120 |
| 6,970,120 | B1 * | 11/2005 | Bjornsen | 341/120 |

OTHER PUBLICATIONS

Gan et al., U.S. Appl. No. 60/396,066, filed Jul. 15, 2002, entitled "Non-Binary Capacitor Array Calibration Circuit with 22-Bit Accuracy in Successive Approximation Analog-to-Digital Converters".

Gan et al., U.S. Appl. No. 60/346,811, filed Jan. 7, 2002, entitled "Mixed Signal Microcontroller for Novel Capacitance Calibration in Data Converter".

Gan et al., "A Non-Binary Capacitor Array Calibration Circuit with 22-Bit Accuracy in Successive Approximation Analog-to-Digital Converters," The 2002 45th Midwest Symposium on Circuits and Systems, Aug. 4-7, 2002.

International Search Report for PCT/US2006/038215, dated Jan. 19, 2007.

\* cited by examiner

CALIBRATION OF A REDUNDANT NUMBER SYSTEM SUCCESSIVE APPROXIMATION ANALOG-TO-DIGITAL CONVERTER

CROSS-REFERENCE TO RELATED APPLICATION

This application claims the benefit under 35 U.S.C. § 119 (e) of U.S. Provisional Application No. 60/722,275, filed Sep. 30, 2005 and entitled "Calibration of Redundant Number Systems SAR Converter." U.S. Provisional Application No. 60/722,275 includes exemplary systems and methods and is incorporated by reference in its entirety.

BACKGROUND OF THE INVENTION

1. Field of the Invention

The present invention relates in general to the field of signal processing, and more specifically, to a system and method for calibrating a redundant number system successive approximation analog-to-digital converter.

2. Description of the Related Art

Analog-to-digital converters (ADCs) convert analog signals into digital signals. ADCs find widespread use in many mixed signal applications. Converting analog audio signals into digital signals represents a common mixed signal application. Successive approximation register (SAR) ADCs represent a popular ADC technology particularly for medium to high resolution ADCs. Although the acronym "SAR" actually stands for Successive Approximation Register (the logic block that controls the conversion process), "SAR" is generally accepted as the acronym for the successive approximation analog-to-digital converter system itself.

FIG. 1 depicts a general SAR ADC 100 that converts an analog input signal $V_{in}$ into a digital output signal y(n). In general, SAR ADC 100 receives the analog input signal $V_{in}$ and employs a digital-to-analog converter (DAC) 101 and a comparator 106 to convert the analog input signal $V_{in}$ into the digital output signal y(n). The DAC 101 includes an array of 16 converter reference elements $CAP_{15}, CAP_{14}, \ldots, CAP_0$ to develop a 16-bit conversion of the analog input signal $V_{in}$. The values of the converter reference elements can be represented by a sixteen element weight vector $\overline{W}$ with the most significant bit in the initial position. The SAR ADC 100 has a resolution equal to one-half of the value of the least significant bit. The number of converter reference elements in DAC 101 can be increased or decreased to respectively increase or decrease the resolution of the SAR ADC 100.

SAR ADC 100 uses charge redistribution to convert the analog input signal $V_{in}$ into the digital output signal y(n). The 16 converter reference elements of $CAP_{15}, CAP_{14}, \ldots, CAP_0$ are capacitors although other embodiments of SAR ADC 100 can use resistors or other circuit element types. The SAR logic 102 generates a successive approximation converter reference element vector $\overline{C}_j$ where j is an updatable index reference. The values of vector $\overline{C}_j$, $\{CAP_{15}, CAP_{14}, \ldots, CAP_0\}$, control the position of switches 104.15, 104.14, ..., 104.0, 104.GND. SAR ADC 100 begins the conversion process by switching the most significant bit (MSB) switch 104.15 to the $V_{in}$ node to charge the most significant bit (MSB) capacitor $CAP_{15}$ to a value proportional to a voltage level of the analog input signal $V_{in}$. Switches for the remaining converter reference elements are set by vector $\overline{C}_j$ to connect to the $V_{REF}$ node to charge the remaining converter reference elements to reference voltage $V_{REF}$, which provides a bipolar offset from the input voltage $V_{in}$. SAR logic 102 next updates the vector $\overline{C}_j$ to change the position of switches 104.15, 104.14, ..., 104.0 and successively move the total trapped charge between each of the converter reference elements in DAC 101. Comparator 106 senses the voltage between the inverting (−) and non-inverting node (+) and provides a binary output that indicates which node has the higher voltage.

SAR logic 102 initially samples the analog input signal $V_{in}$ by setting vector $\overline{C}_j$ so that each of switches 104.15, ..., 104.0, 104.GND are connected to ground. The sampled analog input voltage $V_{in}$ is held by setting vector $\overline{C}_j$ so that element $CAP_{15}$ is connected to the reference voltage node $V_{REF}$ and the remaining elements are connected to ground GND. Switch 104.GND is then opened allowing the voltage at the inverting terminal of comparator 106 to move in accordance with the settings of switches 104.15, 104.14, ..., 104.0. If all switches 104.15, 104.14, ..., 104.0 are connected to the ground node GND, a voltage equal to $-V_{in}$ appears at the inverting terminal of comparator 106. With $CAP_{15}$ connected to ground, a voltage equal to voltage $V_{REF}$ divided by the ratio of the value of element $CAP_{15}$ to the total of all values of the capacitors in the converter reference element array of DAC 101 appears at the inverting terminal of comparator 106. If the output of comparator is a logical 1, SAR logic 102 latches switch 104.15 to the reference voltage node $V_{REF}$; otherwise SAR logic 102 latches switch 104.15 to the ground node GND. The process continues until the SAR logic 102 has cycled and set each of the switches 104.15, 104.14, ..., 104.0.

Thus, during each move of the total trapped charge, the voltage at the comparator 106 inputs changes in accordance with the setting of switches 104.15, 104.14, ..., 104.0. The SAR logic 102 detects the voltage output of comparator 106. The SAR logic 102 generates a vector $\overline{C}_j$ and sets each element $\{CAP_{15}, CAP_{14}, \ldots, CAP_0\}$ of the vector $\overline{C}_j$ based upon the value of the current setting successive approximation converter reference element vector $\overline{C}_j$ and corresponding output of comparator 106. Thus, if switch 104.15 is 1, i.e. connected to voltage reference node $V_{REF}$, and the output of comparator 106 is logical 1, then $CAP_{15}$ is 1. In the next iteration, if switch 104.14 is then 1 and the output of comparator 106 is logical 0, then $CAP_{14}$ is 0, and so on until SAR logic 102 determines each element of the vector $\overline{C}_j$. SAR logic 102 determines the digital value of the analog input signal $V_{in}$ by determining the dot product of an element weight vector $\overline{W}$ and converting the scalar result into a digital output value digital output signal y(n). In at least one embodiment, SAR ADC 100 is configured and operates as described in U.S. Pat. No. 6,844,840, "Successive-Approximation-Register (SAR) Analog-To-Digital Converter (ADC) and Method Utilizing N Three-Way Elements", inventor John L. Melanson, assigned to Cirrus Logic, Inc., and issued Jun. 18, 2005, referred to herein as "Melanson Patent". The Melanson Patent is hereby incorporated by reference in its entirety.

The weight vector $\overline{W}=\{CAP_{15}, CAP_{14}, \ldots, CAP_0\}$. The values of $CAP_{15}, CAP_{14}, \ldots, CAP_0$ can be based upon any radix. In one embodiment, a radix of 2 is used so that the weight vector $\overline{W}=\{CAP_{15}, CAP_{15}/(2^1), CAP_{15}/(2^2), \ldots, CAP_{15}/(2^{15})\}$. In other embodiments, a radix of less than 2 is used, such as a radix equal to 1.8 so that the weight vector $\overline{W}=\{CAP_{15}, CAP_{15}/(1.8^1), CAP_{15}/(1.8^2), \ldots, CAP_{15}/(1.8^{15})\}$. Other redundant number systems include binary number systems that include one or more repeating elements, for example $\{1, \frac{1}{2}, \frac{1}{4}, \frac{1}{8}, \frac{1}{16}, \frac{1}{16}, \frac{1}{32}, \frac{1}{64}, \ldots\}$. The repeating elements are added to generate a desired amount of redundancy. In another embodiment, the additional elements do not have to be the same. For example, a binary sequence with inserted elements that are not power of 2 multiples can be used such as $\{1, \frac{1}{2}, \frac{1}{4}, \frac{1}{8}, \frac{1}{16}, .75/16, \frac{1}{32}, \frac{1}{64}, \ldots\}$.

As described in exemplary embodiments of U.S. Pat. No. 4,336,526, using a radix of less than two provides one embodiment of a redundant number system. Using a redundant number system provides overlap in the conversion process of SAR logic 102, thus, allowing for imprecision in the fabrication of the actual converter reference elements in DAC 101. U.S. Pat. No. 4,336,526, entitled "Successive Approximation Analog-to-Digital Converter Using Non-Binary Series", inventor Basil Weir, and issued on Jun. 22, 1982, is hereby incorporated by reference in its entirety.

The converter reference elements of DAC 101 are generally fabricated as part of an integrated circuit. Although the values of converter reference elements are designed with specific values, the exact values of $CAP_{15}, CAP_{14}, \ldots, CAP_0$ are generally unknown.

SUMMARY OF THE INVENTION

In one embodiment of the present invention, a method of calibrating a redundant number system analog-to-digital converter (RNS ADC), wherein the RNS ADC includes N analog converter reference elements, each of the analog converter reference elements is associated with a weight in a weight vector $\overline{W}$, and N is an integer greater than one includes successively approximating each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$, wherein M is a positive integer. The method further includes using differences between converter reference element vectors of each of the M respective pairs to determine a final weight vector $\overline{W}_B$.

In another embodiment of the present invention, a redundant number system, analog-to-digital converter includes an input to receive an input signal. The redundant number system, analog-to-digital converter further includes N analog converter reference elements, coupled to the input, wherein each of the analog converter reference elements is associated with a weight in a weight vector $\overline{W}$, and N is an integer greater than one. The redundant number system, analog-to-digital converter also includes conversion logic, coupled to the analog converter reference elements, to successively approximate each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$, wherein M is a positive integer. The redundant number system, analog-to-digital converter further includes calibration logic, coupled to the conversion logic to use differences between converter reference element vectors of each of the M respective pairs to determine a final weight vector $\overline{W}_B$.

In a further embodiment of the present invention, a signal processing system includes a redundant number system successive approximation register (RNS ADC). the RNS ADC includes a digital-to-analog converter, wherein the digital-to-analog converter includes N analog converter reference elements, each of the analog converter reference elements is represented as a weight in a weight vector $\overline{W}$, and N is an integer greater than one. The RNS ADC further includes an input to receive a test analog input signal, wherein the analog input signal has a corresponding digital value within a conversion overlap region of the RNS ADC and a comparator, coupled to the input and digital-to-analog converter to generate a comparison signal. The RNS ADC also includes conversion logic, coupled to the analog reference signal generator, to receive the comparison signal and to cause the digital-to-analog converter to successively approximate each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$, wherein M is a positive integer. The RNS ADC further includes calibration logic, coupled to the conversion logic, to use differences between converter reference element vectors of each of the M respective pairs to determine a final weight vector $\overline{W}_B$.

In another embodiment of the present invention, an apparatus to calibrate a redundant number system successive approximation register (RNS ADC), wherein the RNS ADC includes N analog converter reference elements, each of the analog converter reference elements is represented as a weight in a weight vector $\overline{W}$, and N is an integer greater than one includes means for successively approximating each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$, wherein M is a positive integer. The apparatus also includes means for using differences between converter reference element vectors of each of the M respective pairs to determine a final weight vector $\overline{W}_B$.

In a further embodiment of the invention, a method of calibrating a redundant number system, analog-to-digital converter includes selecting an input voltage, converting the input voltage into a first conversion, and forcing conversion of the input voltage into a second conversion, wherein the first conversion is different than the second conversion. The method also includes calibrating the redundant number system, analog-to-digital converter using the first and second conversions.

In another embodiment of the present invention, a redundant number system, analog-to-digital converter includes an input to receive an input voltage and a converter to convert the input voltage into a first conversion and to force conversion of the input voltage into a second conversion, wherein the first conversion is different than the second conversion. The converter further includes a calibrator to calibrate the redundant number system, analog-to-digital converter using the first and second conversions.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
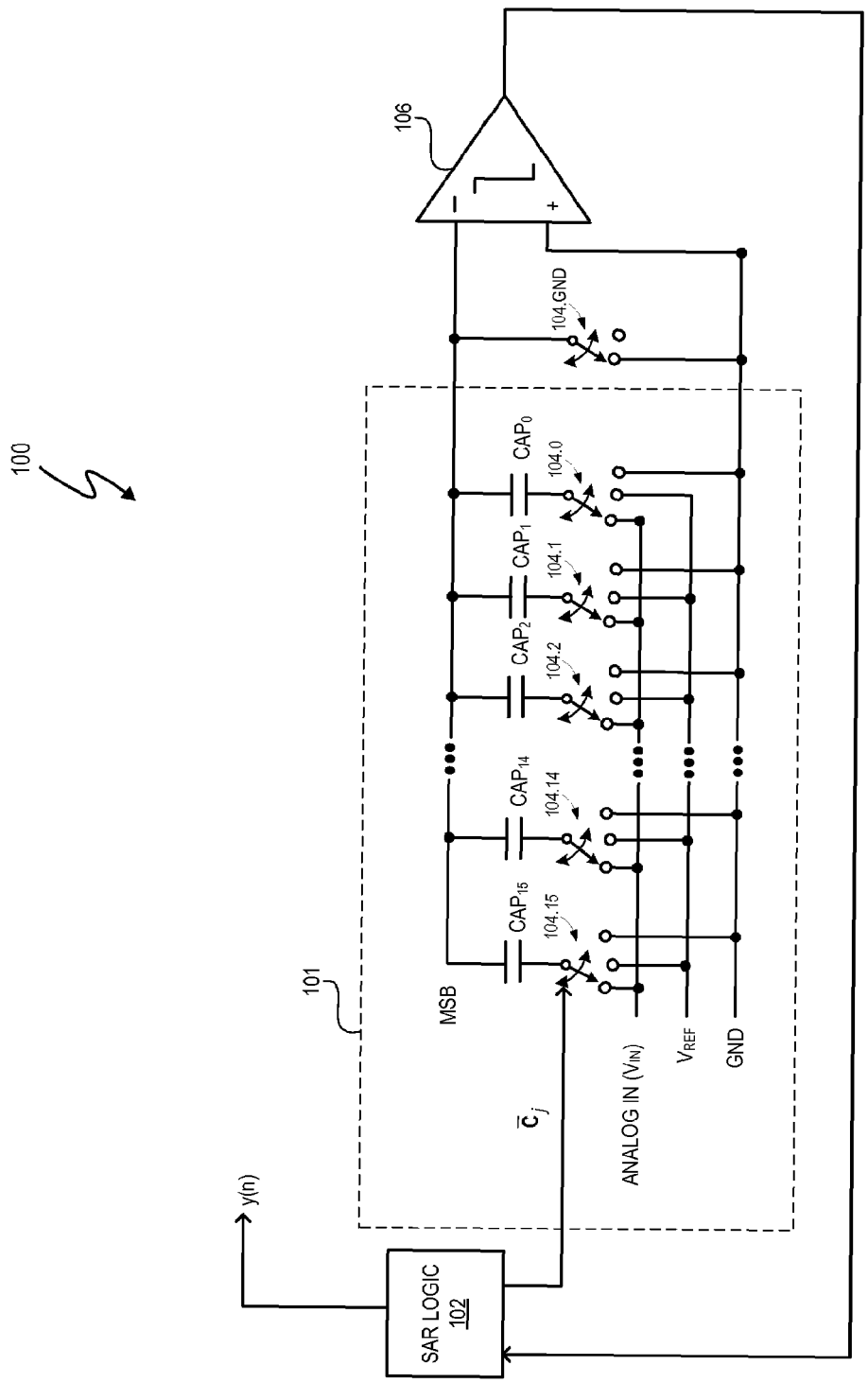
FIG. 1 (labeled prior art) depicts a successive approximation register analog to digital converter.

A system and method calibrate a redundant number system analog-to-digital converter (RNS ADC) using successive approximations of multiple input signals and approximating each input signal at least twice. The RNS ADC includes N analog converter reference elements, each of the analog converter reference elements is associated with a weight in a weight vector $\overline{W}$, and N is an integer greater than one. In a redundant number system, many input signals can correspond to at least two distinct converter reference element conversions. Each converter reference element conversion can be represented as a vector. The system and method successively approximate each of M distinct analog input signals twice to generate M respective pairs of successive approximation converter reference element vectors, $\overline{C}_{1_j}$ and $\overline{C}_{2_j}$, that correspond to digital approximations of the input signals, wherein $j \in \{0, 1, \ldots, M-1\}$ and M is a positive integer. The system and method utilize differences between the successive approximation converter reference element vectors $\overline{C}_{1_j}$ and $\overline{C}_{2_j}$ to determine a final weight vector $\overline{W}_B$. Thus, in at least one embodiment, the difference between $\overline{C}_{1_j} \cdot \overline{W}_B$ and $\overline{C}_{2_j} \cdot \overline{W}_B$ can be used to determine the final weight vector $\overline{W}_B$.

Once a final weight vector $\overline{W}_B$ is determined through one of the calibration processes described herein, the RNS ADC 200 can function like a conventional SAR ADC 100 by multiplying a successive approximation converter reference element vector $\overline{C}_j$ times the final weight vector $\overline{W}_B$, i.e. $\overline{C}_j \cdot \overline{W}_B$, and converting the resultant scalar quantity into the digital output signal y(n). Additionally, the final weight vector $\overline{W}_B$ can be determined to provide the best conversion values, which are not necessarily the actual values of the analog reference elements. Thus, in at least one embodiment the determination of the final weight vector $\overline{W}_B$ can correct for non-ideal values of analog reference elements.

In at least one embodiment, speed and accuracy represent key RNS ADC calibration concerns. In at least one embodiment, RNS ADC is designed to make the fewest possible tests to gather calibration data. In at least one embodiment, only those analog input signal values that can cause significantly different conversion pairs should be used. In at least one embodiment, the analog input signal values that can cause significantly different conversions are input signal values that can convert to a value in overlap regions. Also, coarse calibration does not need the accuracy of fine calibration, so calibration speed optimization can be accomplished, for example, by doing fast initial conversions for a number of cycles, and slower, more accurate, conversions once the calibration has partially converged. The fast conversions can be accomplished by, for example, higher clock rate, truncated conversion, or by using the initial capacitor setting in a switched capacitor RNS ADC embodiment as one of the two corresponding conversion data values.

Figure 2:
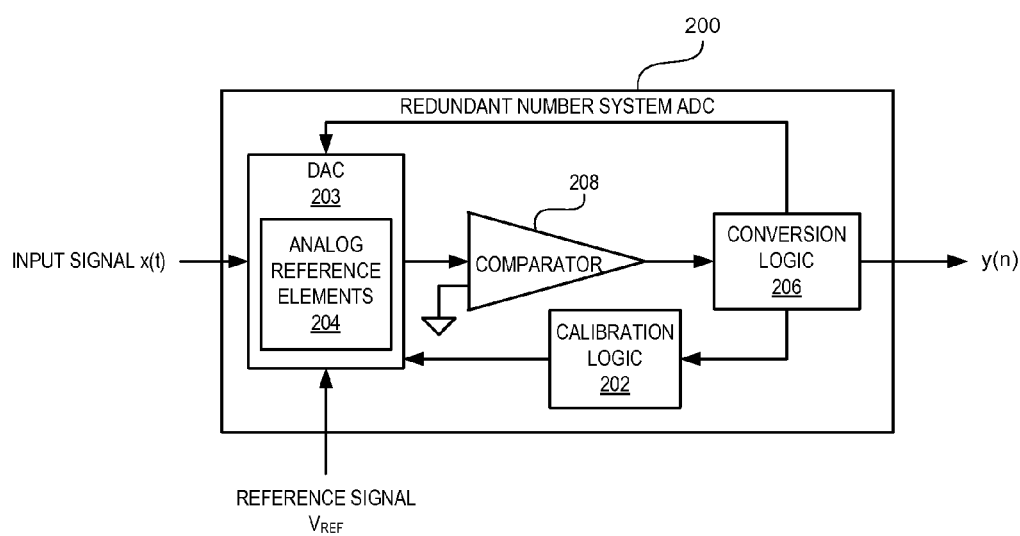
FIG. 2 depicts a redundant number system analog-to-digital converter having calibration logic for redundant number system converter reference elements.

FIG. 2 depicts a redundant number system analog-to-digital converter 200 that uses successive approximation and RNS calibration logic 202 to determine a calibrated reference element weight vector. The analog input signal x(t) to the RNS ADC 200 is an analog signal, and "t" represents a specific time at which the analog input signal x(t) has a specific value. The RNS ADC 200 converts the analog input signal x(t) into a digital output signal y(n).

In general the RNS ADC 200 includes an input to receive an input voltage. The input voltage can be selected so that the input voltage converts to two conversions within a conversion overlap region of a redundant number system. The RNS ADC 200 also includes a converter, such as conversion logic 206, to convert the input voltage into a first conversion and to force conversion of the input voltage into a second conversion, wherein the first conversion is different than the second conversion. The RNS ADC 200 also includes a calibrator, such as calibration logic 202, to calibrate the redundant number system, analog-to-digital converter using the first and second conversions. In at least one embodiment, the RNS ADC 200 repeats the process for multiple input signals, for example at least 100 repetitions, and uses the differences between each pair of conversions to determine a final weight vector $\overline{W}_B$ that is used to convert input signals during normal operations of RNS ADC 200.

In at least one embodiment, RNS ADC 200 is a switched capacitor SAR and, other than during calibration, converts analog input signal x(t) into a digital output signal y(n) in the same manner as SAR ADC 100. In a switched capacitor configuration, the analog converter reference elements 204 of DAC 203 are capacitors. The RNS ADC 200 can be configured using any other type of analog converter reference elements, such as resistors, and convert the analog input signal analog input signal x(t) into the digital output signal y(n). In at least one embodiment, the number of analog converter reference elements 204 is N, and N is a positive integer and equals, for example, twenty-two. The analog converter reference elements 204 implement a redundant number system. In at least one embodiment, the values of the analog converter reference elements 204 utilize a redundant number system as described with reference to SAR ADC 100. For example, in at least one embodiment, the analog converter reference elements 204 all have a radix <2, duplicate reference element values are used, and/or at least two numerically adjacent weight elements differ by a power factor less than 2.

Figure 3:
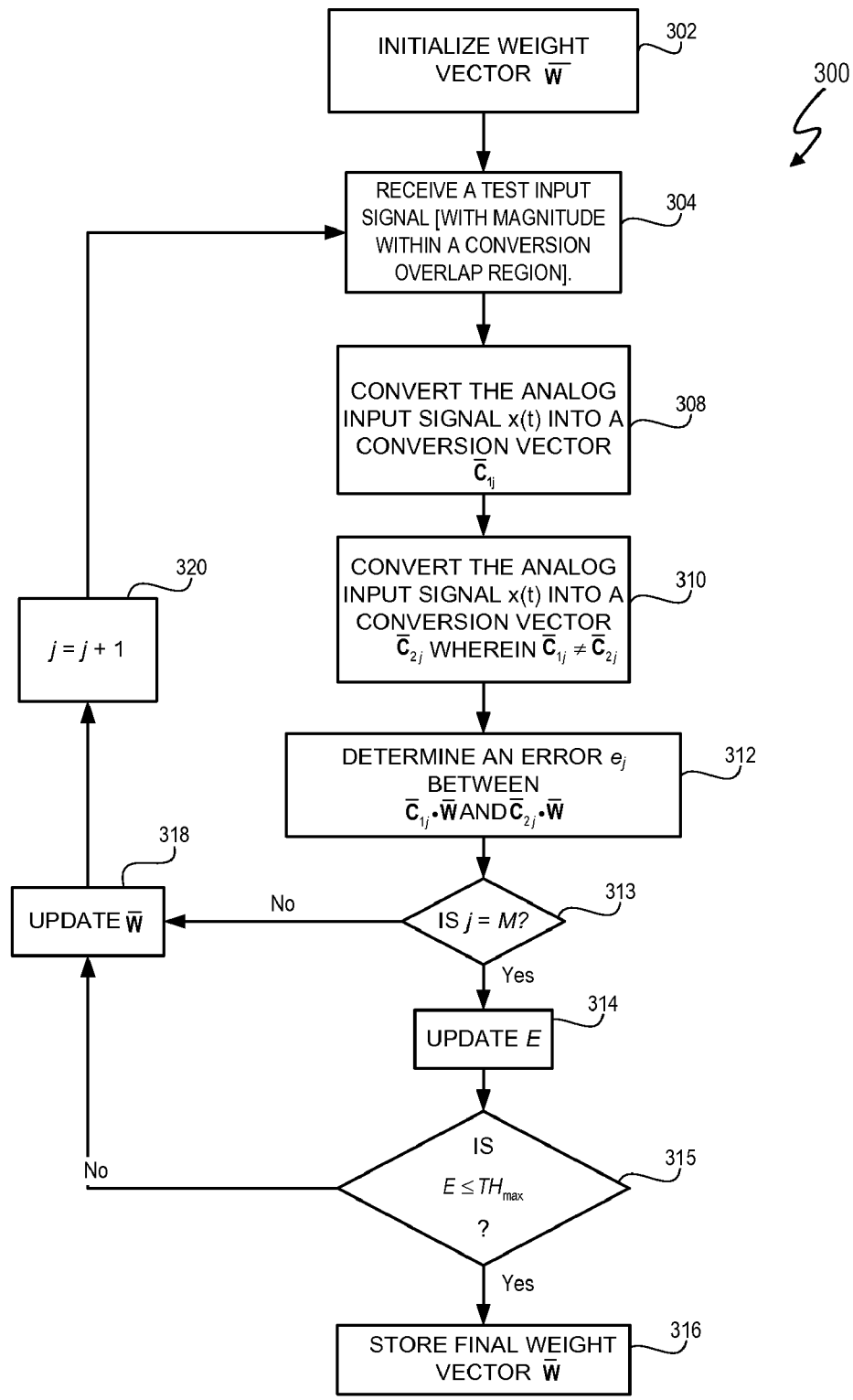
FIG. 3 depicts an iterative calibration process to determine a final weight vector.

Referring to FIGS. 2 and 3, in at least one embodiment, RNS ADC 200 is calibrated in accordance with an iterative calibration process 300. Operation 302 initializes weight vector $\overline{W}$, where $\overline{W} = \{w_0, w_1, \ldots, w_{N-1}\}$ and $w_0$ represents the most significant bit element of the analog converter reference elements 204, $w_1$ represents the next most significant bit element (i.e. the largest) of the analog converter reference elements 204, and so on, with $w_{N-1}$ representing the least significant bit element (i.e. the smallest) of the analog converter reference elements 204. In a switched capacitor implementation of RNS ADC 200, each weight w is associated with a value of a capacitor reference element in DAC 203. In at least one embodiment, the weight vector $\overline{W}$ is initialized using the intended design values of each element in the analog converter reference elements 204. As previously discussed, because of various factors, such as fabrication error and electrical characteristic change over time, the intended values generally do not match the actual values of analog converter reference elements 204. Additionally, in at least one embodiment the final weight vector $\overline{W}_B$ does not reflect the actual values of analog reference elements 204 but rather is used to obtain the best conversions of analog input signal x(t). In at least one embodiment, weight vector $\overline{W}$ is normalized to set a largest weight, $w_0$, equal to a fixed value and all remaining weights to a fraction of the largest weight so that the sum of all weights $w_i$ is equals one for all $i = \{0, 1, \ldots, N-1\}$, i.e.

$$\sum_{i=0}^{N} w_i = 1 \qquad [1]$$

Figure 4:
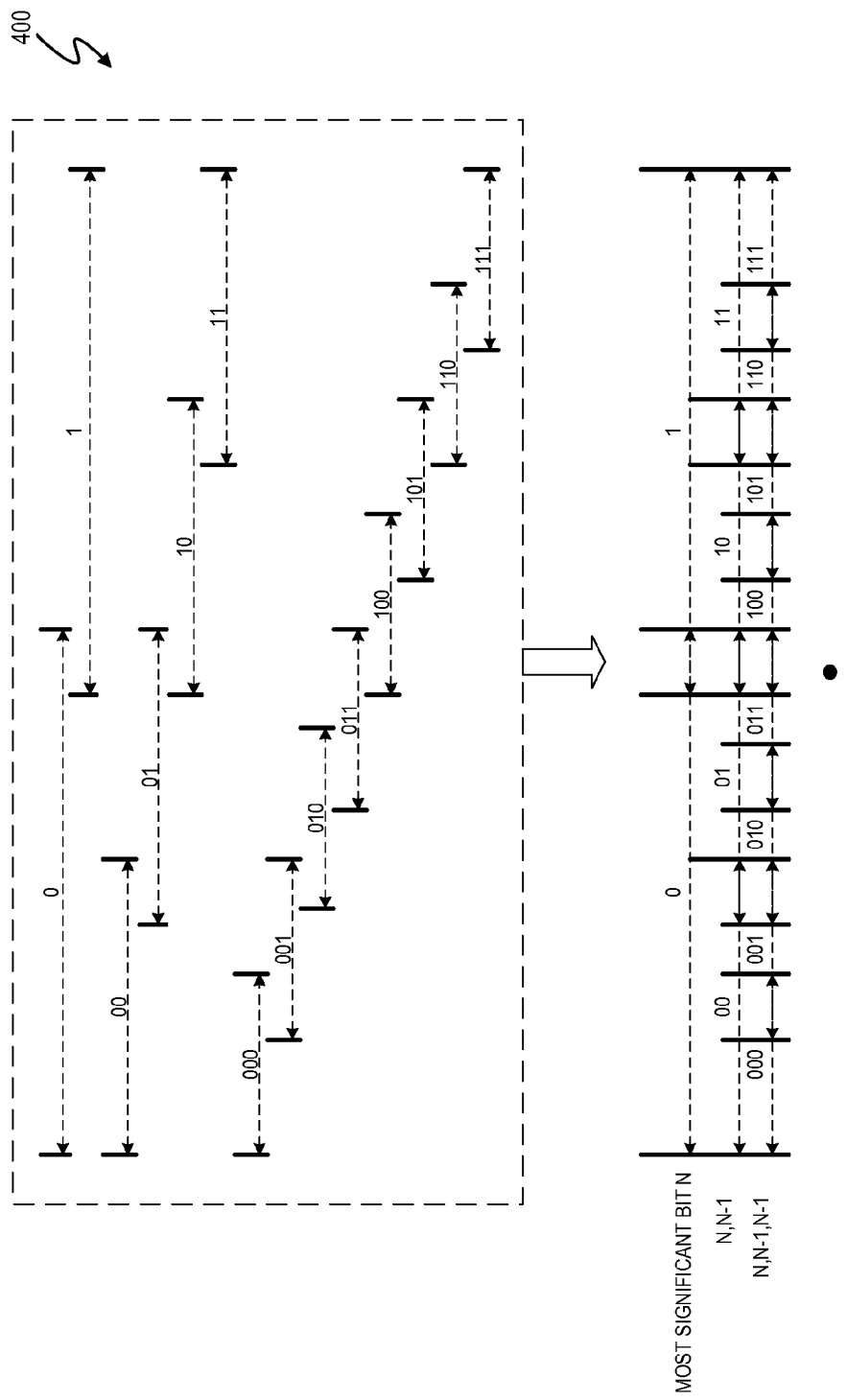
FIG. 4 depicts conversion overlap regions.

Referring to FIGS. 2, 3, and 4, in operation 304, analog input signal x(t) is received by RNS ADC 200. The values of the analog converter reference elements 204 can be calibrated by converting a single analog input signal x(t) into at least two distinct successive approximation converter reference element vectors $\overline{C}_{1_j}$ and $\overline{C}_{2_j}$. Vectors $\overline{C}_{1_j}$ and $\overline{C}_{2_j}$ represent successive approximation converter reference element vectors that correspond to digital approximations of the same, $j^{th}$ sample of the analog input signal x(t). In at least one embodiment, j is initialized to zero (0) for the first conversion of analog input signal x(t). Also, in at least one embodiment, vectors $\overline{C}_{1_j}$ and $\overline{C}_{2_j}$ are binary vectors of length N, and $\overline{C}_{1_j} \cdot \overline{W} \sim \overline{C}_{2_j} \cdot \overline{W}$. Given a sufficient number, e.g. at least 100, of near identities of $\overline{C}_{1_j} \cdot \overline{W} \sim \overline{C}_{2_j} \cdot \overline{W}$, the calibration logic 202 can determine a final weight vector $\overline{W}_B$.

The most useful information in calibrating the RNS ADC 200 occurs when the successive approximation converter reference element vectors $\overline{C}_{1_j}$ and $\overline{C}_{2_j}$ are determined from an analog input signal x(t) having a magnitude that causes different conversions of analog input signal x(t) within 'conversion overlap regions'. In at least one embodiment, the greater the difference between vectors $\overline{C}_{1_j}$ and $\overline{C}_{2_j}$, the more useful the difference is in determining a final weight vector $\overline{W}_B$. FIG. 4 depicts a binary redundant number system 400 with multiple conversion overlap regions for a three bit binary sequence. The redundant number system used by RNS ADC 200 to successively approximate analog input signal x(t) creates convergence overlap regions, depicted by areas where overlap areas exist. In a conversion overlap region, the RNS ADC 200 can convert an analog input signal x(t) into two (2) distinct outputs. The overlap regions in FIG. 4 can be expanded to cover a number sequence of virtually any length.

Operation 308 uses comparator 208 to convert the analog input signal x(t) to successive approximation converter reference element vector $\overline{C}_{1_j}$ using the analog converter reference elements 204 of DAC 203. Operation 310 uses comparator 208 to convert the same analog input signal x(t) to successive approximation converter reference element vector $\overline{C}_{2_j}$ using the analog converter reference elements 204 of DAC 203. In operations 308 and 310, calibration logic 202 provides data to conversion logic 206 to ensure that conversion logic 206 converts each analog input signal x(t) twice, and each conversion results in two distinct digital approximations of successive approximation converter reference element vectors $\overline{C}_{1_j}$ and $\overline{C}_{2_j}$. In at least one embodiment, conversion logic 206 shifts charge within the analog converter reference elements 204 and interprets the output of comparator 208 in the same manner as SAR ADC 100. In at least one embodiment, the vectors $\overline{C}_{1_j}$ and $\overline{C}_{2_j}$ perform the equivalent function as the vector $\overline{C}_j$ with respect to controlling the state of the switches (not shown) in DAC 203.

For fast convergence, values for analog input signal x(t) are set by calibration logic 202 that can cause significantly different conversions, i.e. absolute value of $[(\overline{C}_{1_j} \cdot W) - (\overline{C}_{2_j} \cdot W)]$ represents a difference that is significant enough so that, in at least one embodiment, the difference converges over time in a relatively short period of time, e.g. less than one second. As previously stated, the values of analog input signal x(t) that can cause significantly different conversions are values that can convert to a value in a conversion overlap region of FIG. 4. Assuming the weight vector $\overline{W}$ is arranged from large to small analog converter reference elements, i.e. left to right within vector $\overline{W}$, digital value equivalents of analog input signal x(t) values of the following form are good because the analog input signal x(t) value can be converted using vectors $\overline{C}_{1_j}$ and $\overline{C}_{2_j}$ with either a leading 1 or 0 such that vectors $\overline{C}_{1_j}$ and $\overline{C}_{2_j}$ are of the form:

X X X X X R R R R R . . .

Each "X" is a forced 0 or 1 to force the analog input signal x(t) to convert into a successive approximation converter reference element vector within a conversion overlap region. "R R R . . ." represents a string of random binary digits determined using a conventional successive approximation process. In at least one embodiment, calibration logic 202 forces conversion logic 206 to use a logical 1 at position in vector $\overline{C}_{1_j}$ and a logical 0 in the same position conversion for vector $\overline{C}_{2_j}$ to force vectors $\overline{C}_{1_j}$ and $\overline{C}_{2_j}$ into conversion overlap regions. If the forced bit is relatively near the most significant bit ("MSB") location, each element in the weight vector $\overline{W}$ will converge rapidly, and, in at least one embodiment, a minimum of calibration cycles will be used by iterative calibration process 300.

Table 1 sets forth example digital representations of value patterns for analog input signal x(t) and forced bit selections for successive approximation converter reference element vectors $\overline{C}_{1_j}$ and $\overline{C}_{2_j}$ that increase the speed of the iterative calibration process 300. The value patterns associated with analog input signal x(t) are for analog reference elements 204 that use a radix of 1.8. Other value patterns are used with other redundant number systems and are constructed to force vectors $\overline{C}_{1_j}$ and $\overline{C}_{2_j}$ into conversion overlap regions.

TABLE 1

| ANALOG INPUT SIGNAL x(t) | $\overline{C}_{1_j}$ Forced Bits | $\overline{C}_{2_j}$ Forced Bits |
|---|---|---|
| 1 0 0 0 0 R R R . . . | 1 . . . | 0 . . . |
| 0 1 1 1 1 R R R . . . | 1 . . . | 0 . . . |
| 1 1 0 0 0 0 R R R . . . | 1 1 . . . | 1 0 . . . |
| 0 0 1 1 1 1 R R R . . . | 0 1 . . . | 0 0 . . . |
| 1 1 1 0 0 0 0 R R R . . . | 1 1 1 . . . | 1 1 0 . . . |
| 0 0 0 1 1 1 1 R R R . . . | 0 0 1 . . . | 0 0 0 . . . |
| 1 0 1 0 0 0 0 R R R . . . | 1 0 1 . . . | 1 0 0 . . . |
| 0 1 0 1 1 1 1 R R R . . . | 0 1 1 . . . | 0 1 0 . . . |
| . | . | . |
| . | . | . |
| . | . | . |

In Table 1, "R R R . . ." represents a string of random binary digits. The bits following the forced bits, as represented by the ellipses, for the successive approximation converter reference element vectors $\overline{C}_{1_j}$ and $\overline{C}_{2_j}$ represent bits that are determined by operations 308 and 310 using conversion logic 206 in accordance with, for example, the conversion process described in the Melanson Patent.

In at least one embodiment applicable to all the calibration processes described herein, the vectors $\overline{C}_{1_j}$ and $\overline{C}hd 2_j$ can be determined using coarse conversions initially followed by finer conversions. So, it is also possible to optimize conversion speed by doing fast initial conversions for a number of cycles, and slower, more accurate, conversion once the calibration has partially converged. The fast conversions can be accomplished by, for example, higher clock rate, truncated conversion, or by using the initial cap setting as one of the two data values. In at least one embodiment, the calibration processes speed can be increased by not updating the least significant bits of vectors $\overline{C}_{1_j}$ and $\overline{C}_{2_j}$ at all until the most significant bits of vectors $\overline{C}_{1_j}$ and $\overline{C}_{2_j}$ have settled down on the coarse adaptation. In at least one embodiment applicable to all the calibration processes described herein, the LSBs can be treated as one "master element" or ensemble. For example, if the relative values of the smaller 8 or so analog converter reference elements 204 are known and adapt them as one element.

In at least one embodiment, a goal of iterative calibration process 300 is to use the differences between vectors $\overline{C}_{1_j}$ and $\overline{C}_{2_j}$ of each of the M respective pairs to determine a final weight vector $\overline{W}_B$.

During each cycle of iterative calibration process 300, operation 312 determines an error $e_j$ between $\overline{C}_{1_j} \cdot \overline{W}$ and $\overline{C}_{2_j} \cdot \overline{W}$. The first error $e_0$ is determined from Equation [2] and:

$$e_0 = [(\overline{C}_{1_0} - \overline{C}_{2_0}) \cdot \overline{W}_{init}]^2 \qquad [2].$$

$\overline{W}_{init}$ represents an initial weight vector. In at least one embodiment, the values of initial weight vector $\overline{W}_{init}$ are the intended design values of each element in the analog converter reference elements 204, and initial weight vector $\overline{W}_{init}$ is normalized in accordance with Equation [1].

Operation 313 ensures that the iterative calibration process 300 cycles at least M times so that a sufficient number of errors have been determined to provide a meaningful evaluation of $e_j$. If operation 313 determines that j<M, then the weight vector $\overline{W}$ is updated in accordance with Equation [3] using a least mean square process:

$$\overline{W}_0 = \overline{W}_{init} - (\overline{C}_{1_0} - \overline{C}_{2_0}) \cdot e_0 \cdot \mu \qquad [3].$$

where $\mu$ is a gain. In at least one embodiment, the gain $\mu$ increases a rate of convergence of the error $e_i$ to within the predetermined thresholds. In at least one embodiment, $\mu$ is a vector $\overline{\mu}$, and element values of the vector $\overline{\mu}$ have a decreasing step size so that an element modifying a more significant bit of $(\overline{C}_{1_j} - \overline{C}_{2_j})$ is larger than an element modifying a lesser significant bit. Operation 320 updates the index j by one. Operation 304 then receives a new analog input signal x(t) that is preferably set by calibration logic 202 as previously described so that successive approximation converter reference element vectors $\overline{C}_{1_j}$ and $\overline{C}_{2_j}$ are within a conversion overlap region.

During subsequent cycles of iterative calibration process 300, operation 312 updates the error in accordance with Equation [4]:

$$e_i = [(\overline{C}_{1_i} - \overline{C}_{2_i}) \cdot \overline{W}_i]^2 \qquad [4].$$

Operation 318 updates the weight vector $\overline{W}$ in accordance with Equation [5]:

$$\overline{W}_i = \overline{W}_{i-1} - (\overline{C}_{1_i} - \overline{C}_{2_i}) \cdot e_i \cdot \mu \qquad [5].$$

Over M cycles of iterative calibration process 300, the absolute value of the error $e_j$ will generally oscillate and eventually converge towards a smaller threshold value $TH_{max}$. Operation 314 determines an error E. The error E is based on the previous individual errors $e_j$. In at least one embodiment, the error E represents a square of a running average of $e_j$ for all $j \geq M$. Operation 315 determines whether the error E is less than or equal to a maximum threshold value $TH_{max}$. The error E is a function of previous errors $e_j$ for all $j \geq M$. The threshold value $TH_{max}$ is a matter of design choice and represents a desired accuracy between the determined final weight vector $\overline{W}_B$ and the actual value of the analog converter reference elements 204. The value of M is also a matter of design choice and can be determined, for example, by simulating RNS ADC 200 to determine a number of cycles of iterative calibration process 300 needed so that the error $e_j$ converges below the threshold value $TH_{max}$. In at least one embodiment, M equals 100.

If operation 315 determines that the error E is less than or equal to $TH_{max}$, then operation 316 stores the last weight vector determined by operation 318 as the final weight vector $\overline{W}_B$. However, if E is outside of the threshold values, operations 318, 320, and 304-315 continue until E is less than or equal to $TH_{max}$. In at least one embodiment, operation 318 uses a least mean square process to determine $\overline{W}_0$ in accordance with Equation [6]:

$$\overline{W}_0 = \overline{W}_{init} - (\overline{C}_{1_0} - \overline{C}_{2_0}) \cdot e_0 \cdot \mu \qquad [6]$$

where $\mu$ is a gain. In at least one embodiment, $\mu$ is a vector $\overline{\mu}$, and element values of the vector $\overline{\mu}$ have a decreasing step size so that an element modifying a more significant bit of $(\overline{C}_{1_j} - \overline{C}_{2_j})$ is larger than an element modifying a lesser significant bit.

In another embodiment, operation 314 is not used, and when operation 313 determines that j=M, iterative calibration process 300 proceeds directly to operation 316 after cycling through operations 304-313 and 320 M times.

Figure 5:
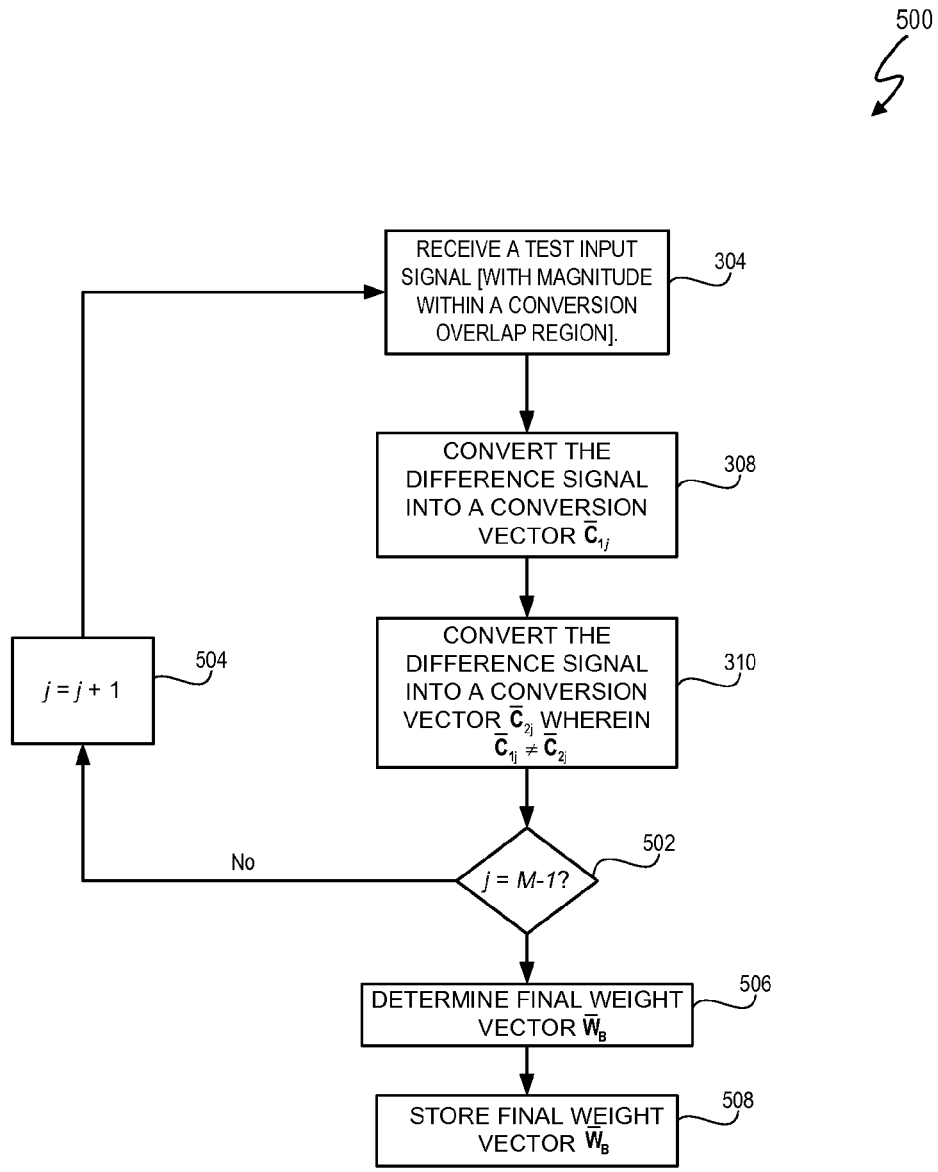
FIG. 5 depicts a group calibration process to determine a final weight vector.

FIG. 5 depicts group calibration process 500. Referring to FIGS. 2 and 5, in at least one embodiment, RNS ADC 200 is calibrated in accordance with group calibration process 500. The iterative calibration process 300 updates the weight vector during each cycle of iterative calibration process 300 and, thus, utilizes a minimum amount of memory because it is unnecessary to store each of the vectors $\overline{C}_{1_j}$ and $\overline{C}_{2_j}$ for all j. Group calibration process 500 uses the differences between converter reference element vectors $\overline{C}_{1_j}$ and $\overline{C}_{2_j}$ of each of M respective pairs of vectors $\overline{C}_{1_j}$ and $\overline{C}_{2_j}$ to determine a final weight vector $\overline{W}_B$ directly without the iteration of iterative calibration process 300. The group calibration process 500 requires more memory than iterative calibration process 300 but is generally faster and more accurate.

In at least one embodiment, operations 304-310 of group calibration process 500 are identical to the same operations in iterative calibration process 300. Operation 502 determines if j equals M. If j does not equal M, then group calibration process 500 repeats operations 304-310 after updating the index j in operation 504 and returning to operation 304. Once operation 502 determines that j equals M, group calibration process 500 has determined M pairs of vectors $\overline{C}_{1_j}$ and $\overline{C}_{2_j}$.

Operation 506 then determines a final weight vector $\overline{W}_B$ using the differences between pairs of vectors $\overline{C}_{1_j}$ and $\overline{C}_{2_j}$. In operation 506, the vectors $\overline{C}_{1_j}$ and $\overline{C}_{2_j}$ can be, for example, organized into a matrix and processed to find the final weight vector $\overline{W}_B$ that minimizes:

$$\frac{1}{M} \sum_{j=0}^{M-1} [(\overline{C}_{1_j} - \overline{C}_{2_j}) \cdot \overline{W}_B]^2. \qquad [7]$$

In at least one embodiment, the value of M is predetermined to be large enough so that the group minimum error $e_{min}$ is less than or equal to a predetermined threshold TH in accordance with Equation [8]:

$$\frac{1}{M} \sum_{j=0}^{M-1} [(\overline{C}_{1_j} - \overline{C}_{2_j}) \cdot \overline{W}_B]^2 \leq TH. \qquad [8]$$

Operation 508 stores the final weight vector $\overline{W}_B$.

In at least one other embodiment, if the conditions of Equation [8] are not met, group calibration process 500 performs additional conversions and after each additional conversion determines the group minimum error $e_{min}$ using Equation [7], with M equaling the number of cycles through operations 304-310, until the conditions of Equation [8] are met. Thus, group calibration process 500 uses the differences between vectors $\overline{C}_{1_j}$ and $\overline{C}_{2_j}$ of each of the M respective pairs to determine a final weight vector $\overline{W}_B$ such that in at least one embodiment:

$$\frac{1}{M} \sum_{j=0}^{M-1} [(\overline{C}_{1_j} - \overline{C}_{2_j}) \cdot \overline{W}_B]^2 \leq TH. \quad [9]$$

Figure 6:
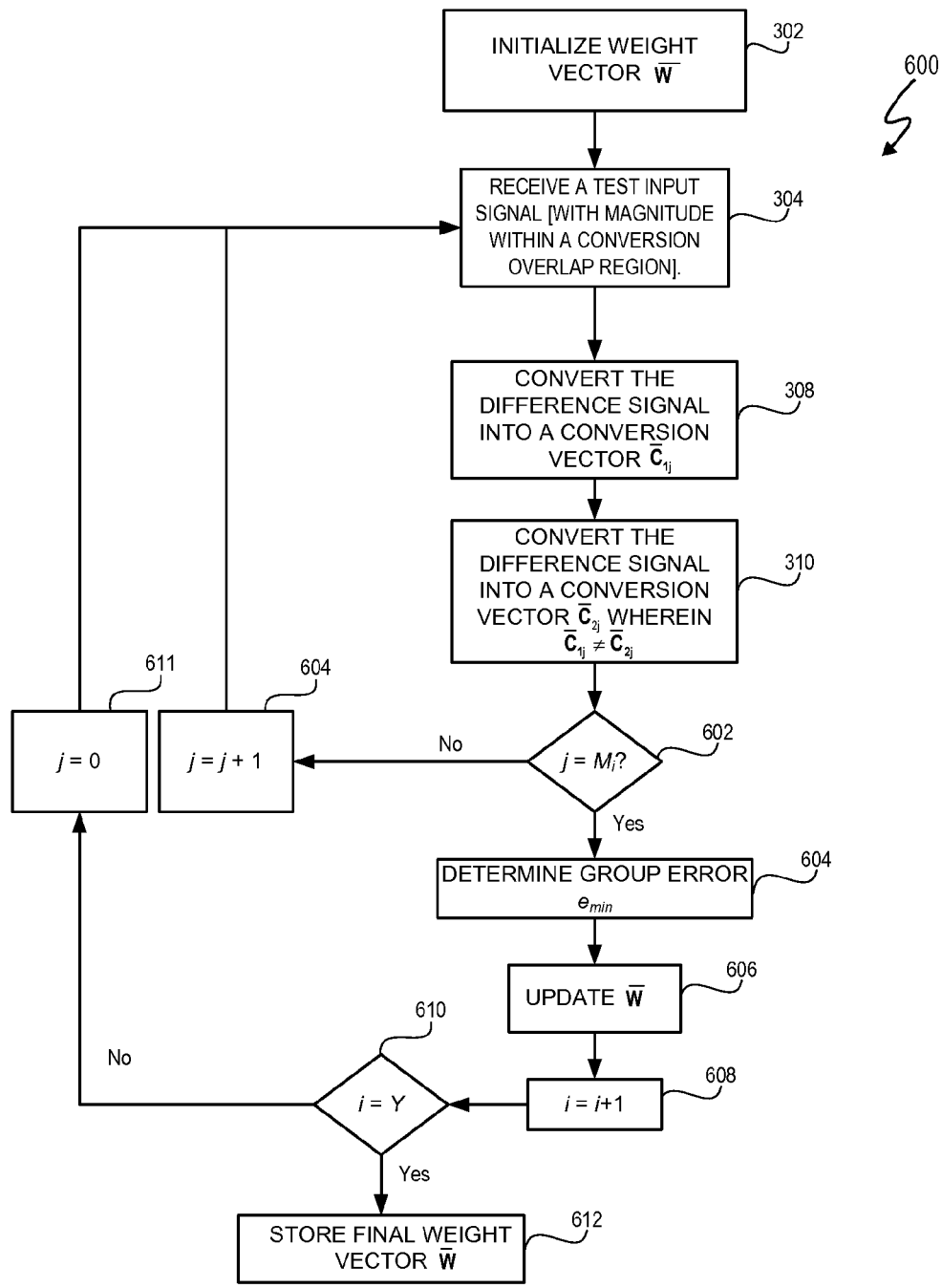
FIG. 6 depicts a multiple group calibration process to determine a final weight vector.
Figure 7A:
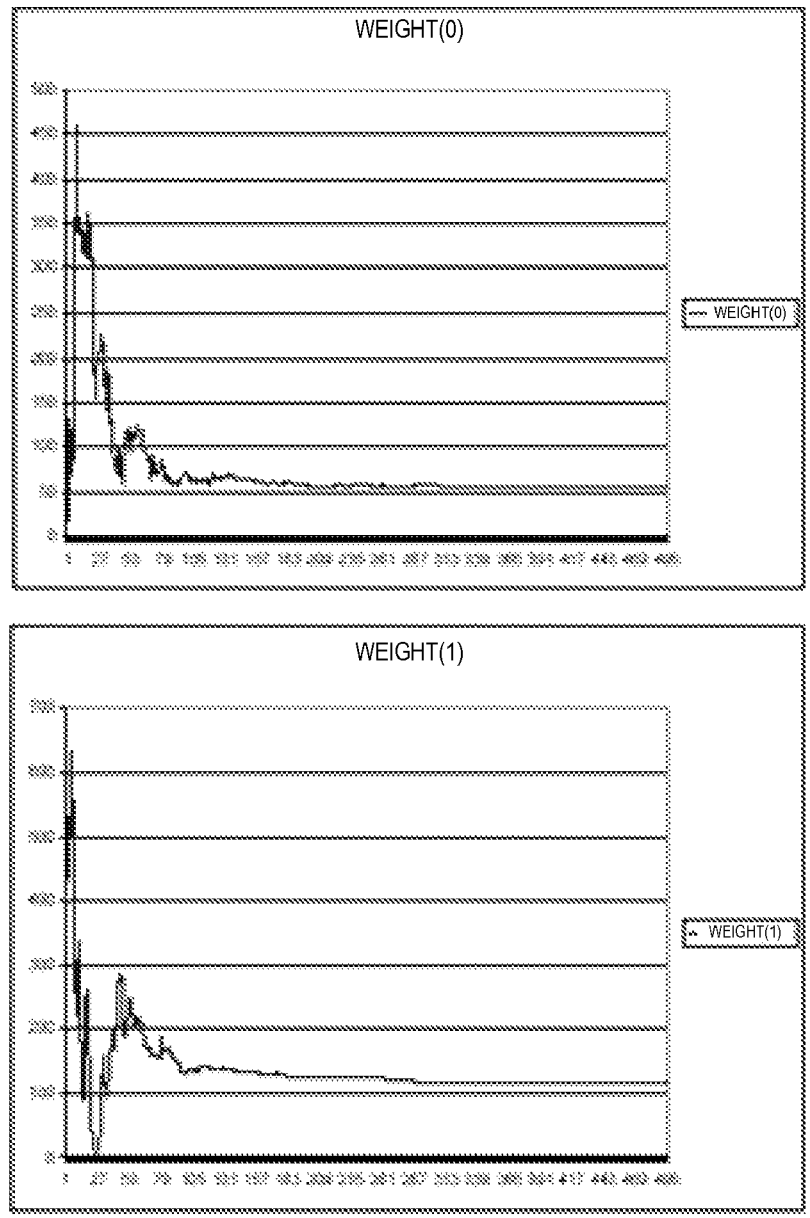
FIGS. 7A-7K depict convergence of elements in a final weight vector during a calibration process to determine the final weight vector.
Figure 7B:
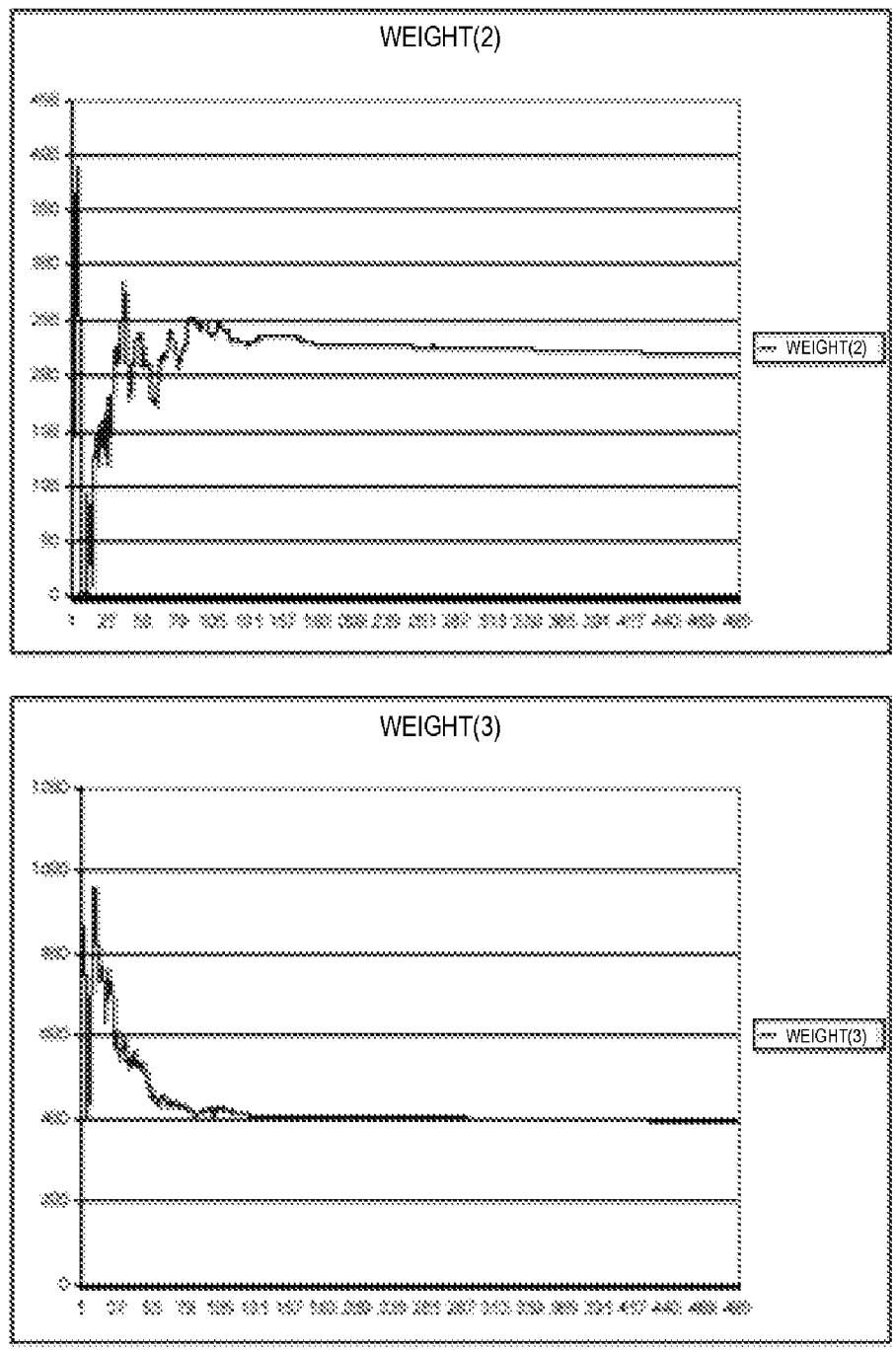
Figure 7C:
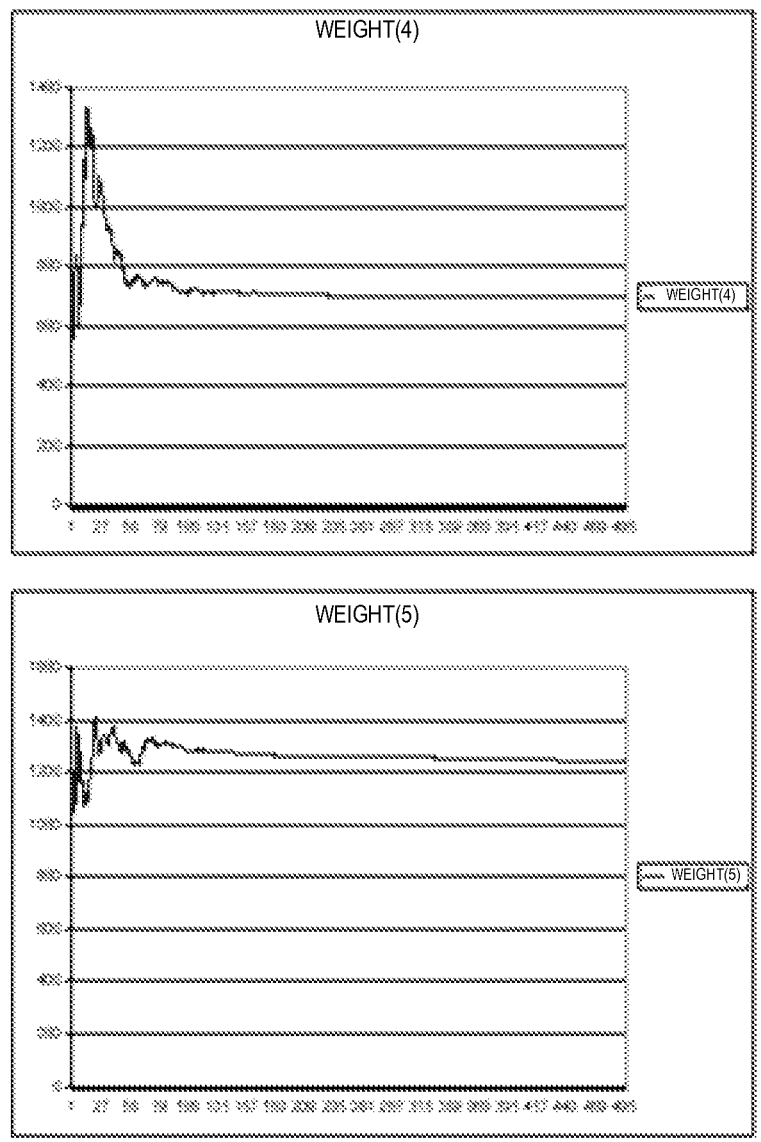
Figure 7D:
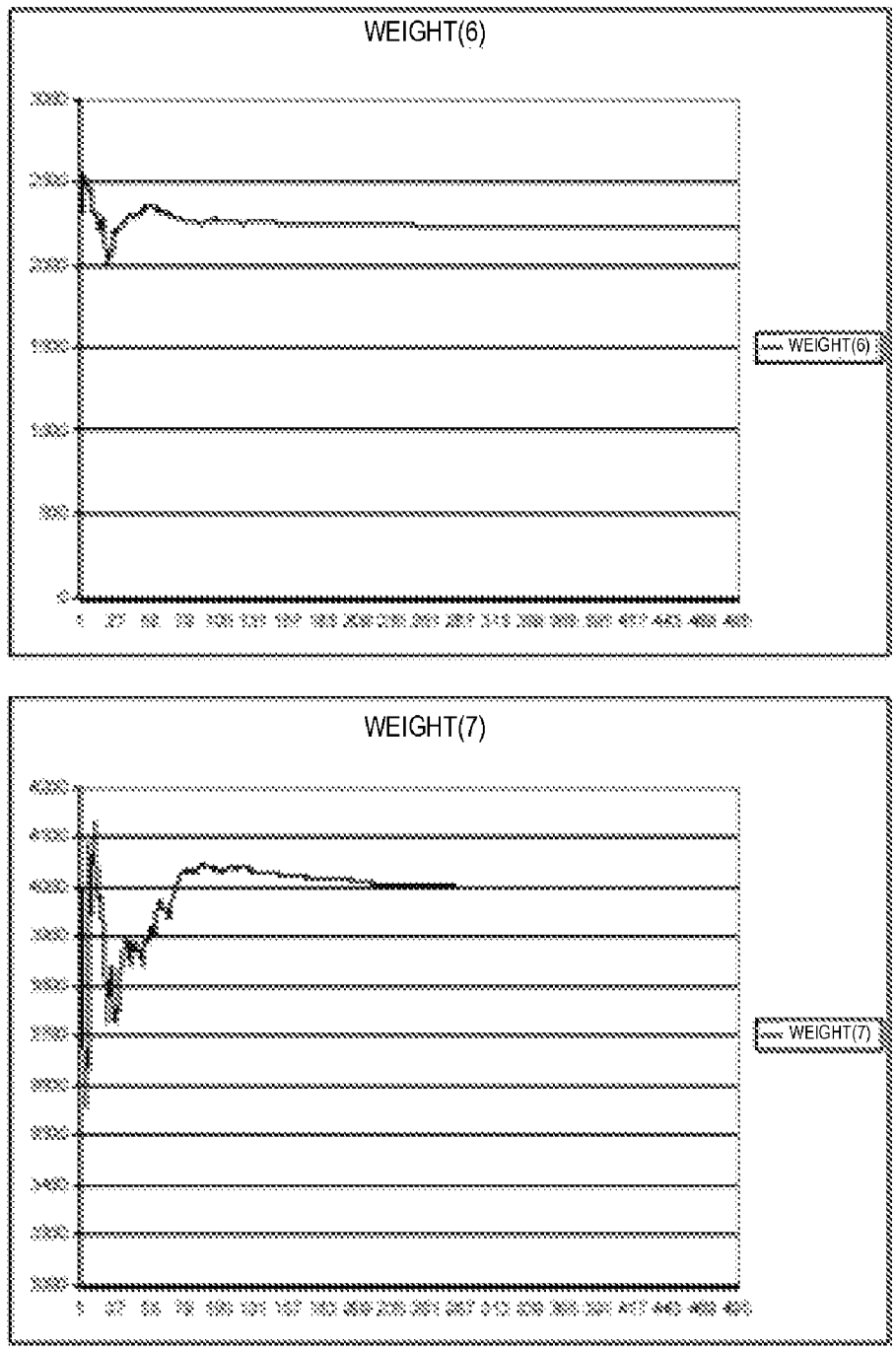
Figure 7E:
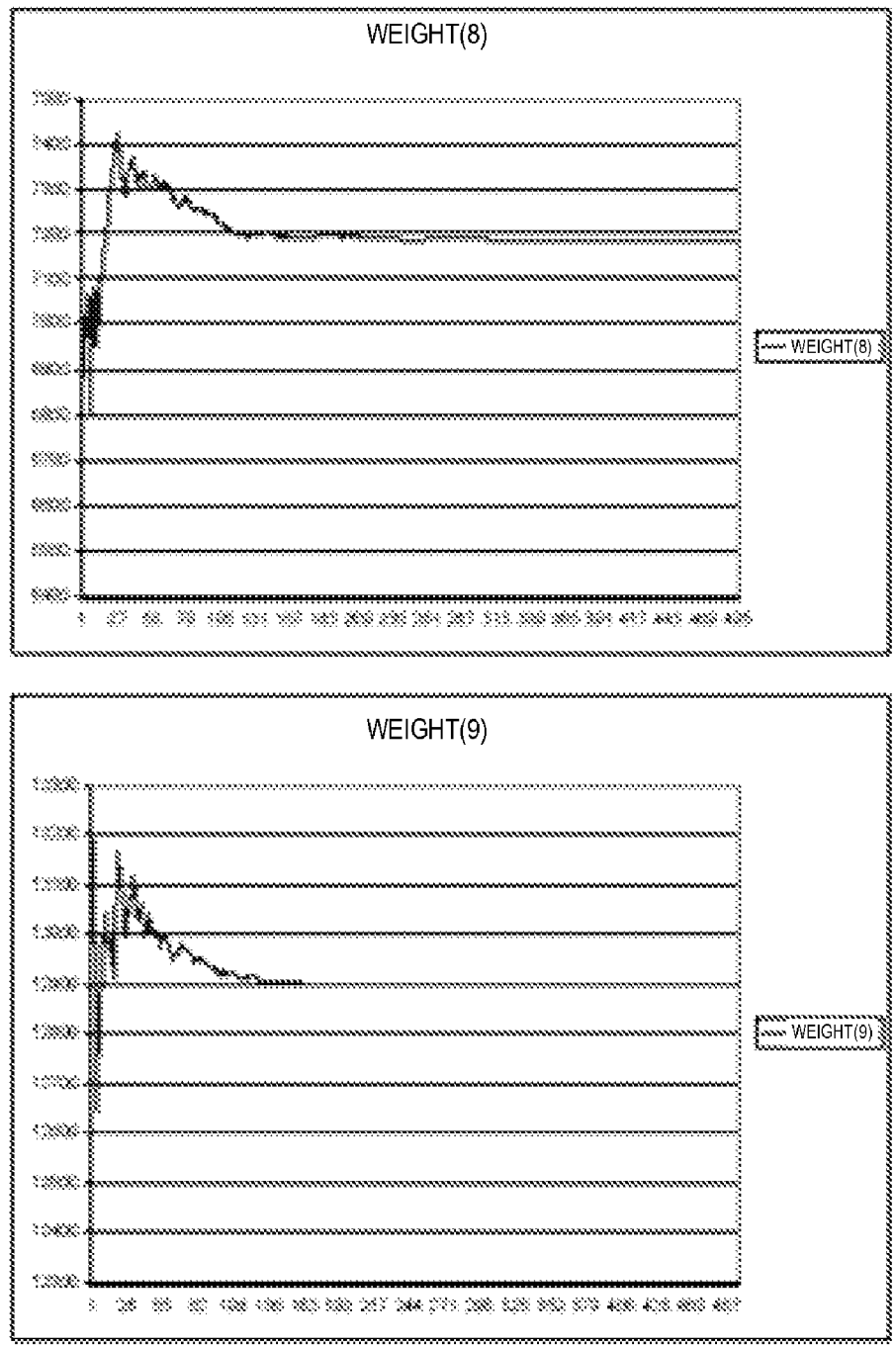
Figure 7F:
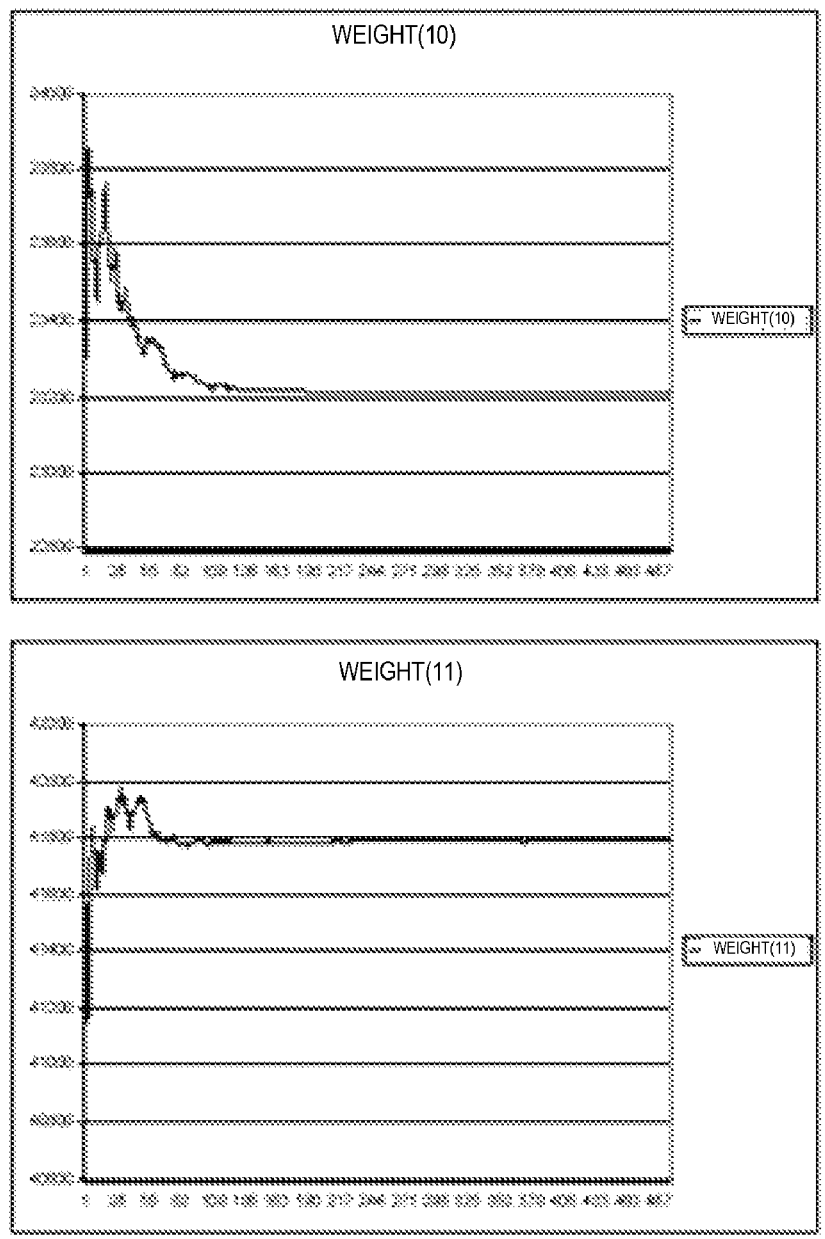
Figure 7G:
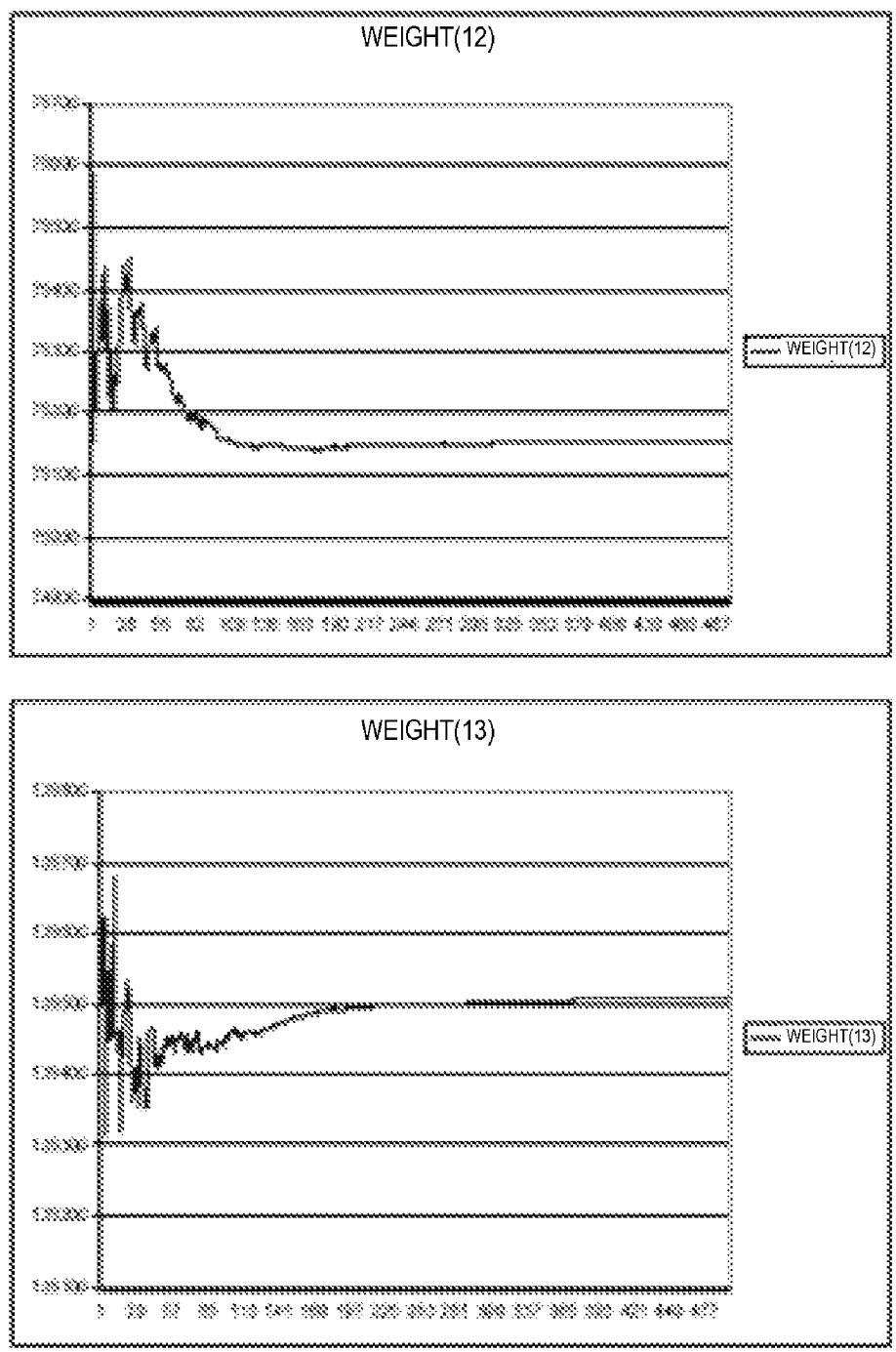
Figure 7H:
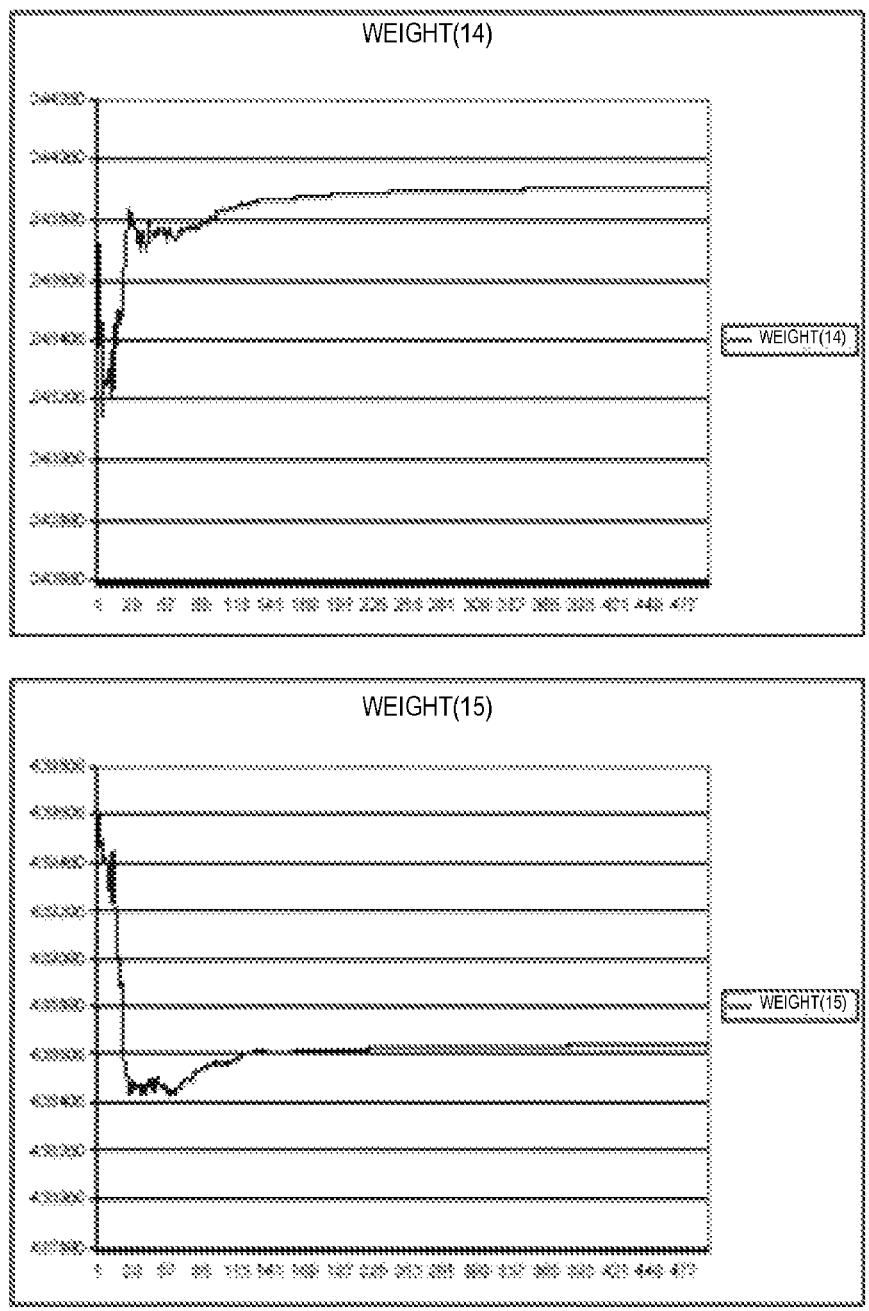
Figure 7I:
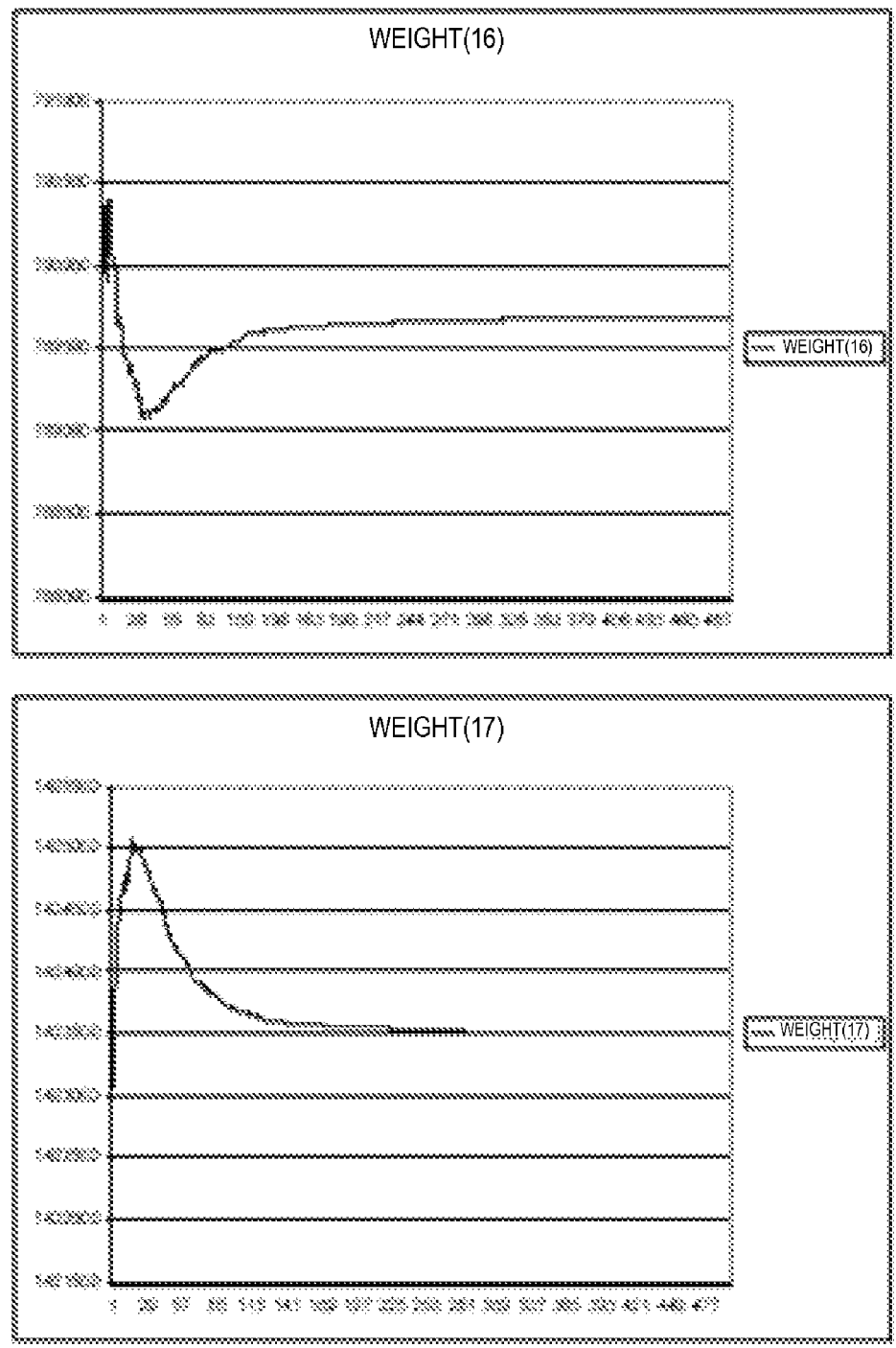
Figure 7J:
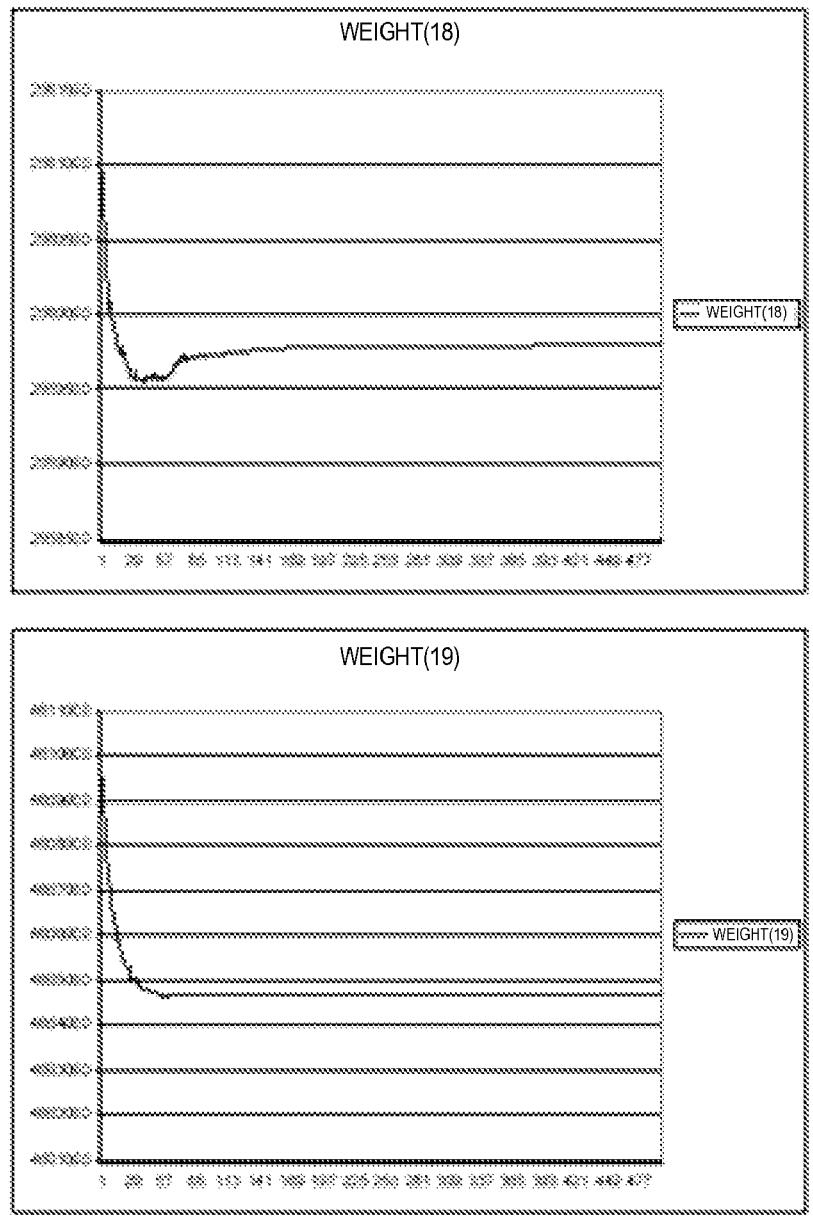
Figure 7K:
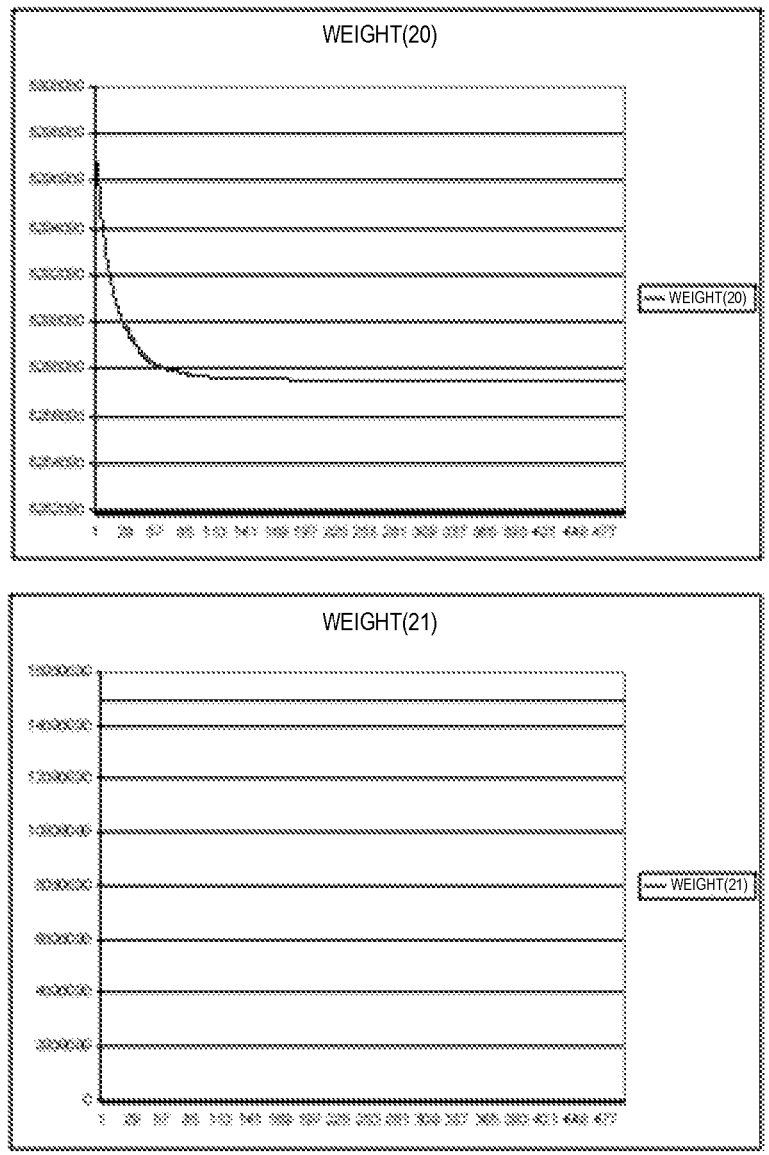

FIG. 6 depicts multiple group calibration process 600. Referring to FIGS. 2 and 6, in at least one embodiment, RNS ADC 200 is calibrated in accordance with multiple group calibration process 600. Group calibration process 600 uses the differences between vectors $\overline{C}_{1_j}$ and $\overline{C}_{2_j}$ from Y−1 multiple groups of $M_i$ respective pairs of vectors $\overline{C}_{1_j}$ and $\overline{C}_{2_j}$ to determine a final weight vector $\overline{W}_B$, where $M_i$ and Y are respective integers greater than one.

The multiple group calibration process 600 represents a hybrid calibration process between iterative calibration process 300 and group calibration process 500. The multiple group calibration process 600 requires more memory than iterative calibration process 300 but less memory than group calibration process 500. The performance and accuracy of multiple group calibration process 600 generally lies between the performance and accuracies of iterative calibration process 300 and group calibration process 500.

In at least one embodiment, the goal of multiple group calibration process 600 is to determine a final weight vector $\overline{W}_B$ using Y iteratively determined weight vectors from respective groups of $M_i$ pairs of vectors $\overline{C}_{1_j}$ and $\overline{C}_{2_j}$, such that weight vector $\overline{W}_0$ for a first group (i=0) is determined so that:

$$\frac{1}{M_0} \sum_{j=0}^{M_0-1} [(\overline{C}_{1_j} - \overline{C}_{2_j}) \cdot \overline{W}_0]^2 \leq TH_0 \quad [10]$$

for all i={1, 2, . . . , Y−1} and using weight vector $\overline{W}_{i-1}$ to determine each subsequent group weight vector $\overline{W}_i$ so that:

$$\frac{1}{B-A+1} \left[ \sum_{j=A}^{B} [(\overline{C}_{1_j} - \overline{C}_{2_j}) \cdot \overline{W}_i]^2 \right] \leq TH_i; \quad [11]$$

wherein $$A = \sum_{k=0}^{i-1} M_k, B = \left( \sum_{k=0}^{i} M_k \right) - 1, M_0, M_1, \ldots, M_{Y-1}$$

each represent a number of pairs of distinct conversions, Y represents a number of groups of pairs of distinct conversions, Y is an integer greater than $$0, M = \sum_{i=0}^{Y-1} M_i,$$

each $TH_i$ for all i={0, 1, 2, . . . , Y−1} is a respective threshold value, and i is an integer greater than zero.

In at least one embodiment, operations 302-310 of multiple group calibration process 600 are identical to the same operations in iterative calibration process 300. Operation 602 determines whether j=$M_i$, which determines whether $M_i$ pairs of successive approximation converter reference element vectors $\overline{C}_{1_j}$ and $\overline{C}_{2_j}$ have been determined, where $M_i$ represents the number of pairs of vectors $\overline{C}_{1_j}$ and $\overline{C}_{2_j}$ in the $i^{th}$ group. If not, operation 604 updates the index j by 1 and operations 304-602 repeat until j=$M_i$. Once j=$M_i$, for the first group, $M_0$, operation 604 determines an initial group error $e_0$ in accordance with Equation [12]:

$$e_0 = \frac{1}{M_0} \sum_{j=0}^{M_0-1} [(\overline{C}_{1_j} - \overline{C}_{2_j}) \cdot \overline{W}_{init}]^2, \quad [12]$$

where $\overline{W}_{init}$ is the normalized, initial weight vector.

The initial operation 606 updates the weight vector $\overline{W}_0$ in accordance with Equation [13]:

$$\overline{W}_0 = \overline{W}_{init} - \frac{1}{M_0} \sum_{j=0}^{M_0-1} [(\overline{C}_{1_j} - \overline{C}_{2_j}) \cdot e_0 \cdot \mu] \quad [13]$$

Operation 608 updates the group index i by one, and operation 610 determines whether all Y−1 groups have been processed. If all Y−1 groups have not been processed, operation 611 resets the index j to 0, and multiple group calibration process 600 cycles. During each subsequent cycle of multiple group calibration process 600, when operation 602 determines that j=M, operation 604 determines the $i^{th}$ group error $e_i$ in accordance with Equation [14]:

$$e_i = \frac{1}{(B-A+1)} \sum_{j=A}^{B} [(\overline{C}_{1_j} - \overline{C}_{2_j}) \cdot \overline{W}_i]. \quad [14]$$

Operation 606 updates the weight vector $\overline{W}_i$ in accordance with Equation [15]:

$$\overline{W}_i = \overline{W}_{i-1} - \frac{1}{(B-A+1)} \sum_{j=A}^{B} [(\overline{C}_{1_j} - \overline{C}_{2_j}) \cdot e_i \cdot \mu]. \quad (15)$$

$\overline{W}_{init}$ is the normalized, initial weight vector and $\mu$ is a gain. In at least one embodiment, $\mu$ is a vector $\overline{\mu}$, and element values of the vector $\overline{\mu}$ have a decreasing step size so that an element modifying a more significant bit of $$\left[ \frac{1}{(B-A+1)} \sum_{j=A}^{B} (\overline{C}_{1_j} - \overline{C}_{2_j}) \right]$$

is larger than an element modifying a lesser significant bit.

When operation 610 determines that i=Y, operation 612 stores $\overline{W}_{Y-1}$ as the final weight vector $\overline{W}_B$.

Once the final weight vector $\overline{W}_B$ is determined through iterative calibration process 300, group calibration process 500, and multiple group calibration process 600, the RNS ADC 200 can function like a conventional SAR ADC 100 by multiplying a successive approximation converter reference element vector $\overline{C}_j$ times the final weight vector $\overline{W}_B$, i.e. $\overline{C}_j \cdot \overline{W}_B$, and converting the resultant scalar quantity into the digital output signal digital output signal y(n).

FIGS. 7A through 7K illustrate the convergence of elements 0 through 21 of a 22 element weight vector $\overline{W}$ during calibration.

Following is one embodiment of a C++ computer program that simulates the operation of at least one embodiment of the RNS ADC 200 and demonstrates an algorithm that generates weights in accordance with at least one embodiment of iterative calibration process 300, for the simulated operation of RNS ADC 200.

```
/*
 * Redundant Radix SAR Calibration
 *
 * Models fully differential input, SAR from the middle,
 * 2 sigma cap matching of 0.2%, coarse calibration,
 * LMS adaptation
 *
 * Copyright 2004,2005 Cirrus Logic, Inc.
 * All Rights Reserved
 */
#include <stdio.h>
#include <stdlib.h>
#include <math.h>
#define VREFP 4.0
#define VREFM 0.0
#define BULK 0.0
#define VCOMP ((VREFP+VREFM)/2.0)
#define LSB    (2*(VREFP-VREFM)/262144.0)
#define NOISE (LSB/2.0)
#define MAXCAPS         32
double awgn(double m, double s);
double pos_top_cap[MAXCAPS], pos_bot_cap[MAXCAPS];
double neg_top_cap[MAXCAPS], neg_bot_cap[MAXCAPS];
int control[MAXCAPS];
long long weight[MAXCAPS];
long long offset;
double Mu;
long NCAPS,NEXTRA,NSCALE;
/*
 * init_caps
 *    Initialize the capacitor array
 */
void init_caps(void)
{
  int i,j;
  double pos_tmp,neg_tmp;
  /* define radix 1.8 cap array */
  pos_top_cap[0] = pos_bot_cap[0] = 50; // parasitic cap
  neg_top_cap[0] = neg_bot_cap[0] = 50; // parasitic cap
  pos_top_cap[1] = pos_bot_cap[1] = 1.0;
  neg_top_cap[1] = neg_bot_cap[1] = 1.0;
  for(i=2;i<=NCAPS;i++)
  {
      pos_top_cap[i] = pos_bot_cap[i] = pow(1.8,i-1);
      neg_top_cap[i] = neg_bot_cap[i] = pow(1.8,i-1);
  }
#define CAP_ERRS
#ifdef CAP_ERRS
  // Add random size changes to cap array ( one sigma = 0.1% error)
  for(i=NCAPS;i>0;i--)
  {
    pos_top_cap[i] *= awgn( 1.0,0.001 );
    pos_bot_cap[i] *= awgn( 1.0,0.001 );
    neg_top_cap[i] *= awgn( 1.0,0.001 );
    neg_bot_cap[i] *= awgn( 1.0,0.001 );
  }
#endif
  /* normalize so each array total is 1.0 */
  pos_tmp = 0.0;
  neg_tmp = 0.0;
  for(i=0;i<=NCAPS;i++)
  {
    pos_tmp += pos_top_cap[i] + pos_bot_cap[i];
    neg_tmp += neg_top_cap[i] + neg_bot_cap[i];
```

```
      }
      for(i=0;i<=NCAPS;i++)
      {
        pos_top_cap[i] = pos_top_cap[i]/pos_tmp;
        pos_bot_cap[i] = pos_bot_cap[i]/pos_tmp;
        neg_top_cap[i] = neg_top_cap[i]/neg_tmp;
        neg_bot_cap[i] = neg_bot_cap[i]/neg_tmp;
      }
}
double pos_Q,neg_Q;
/*
 * sample
 *   Calculate the total charge captured on the array
 *   Q = C * V, where V = the voltage between the switch controlled plate and the high impedance
plate (=VCOMP)
 */
void sample( double Vinp, double Vinn )
{
  int i;
  pos_Q = awgn( 0.0, NOISE ) + ( pos_top_cap[0] + pos_bot_cap[0] ) * ( BULK - VCOMP );     //
parasitic caps are always to bulk (ground)
  neg_Q = awgn( 0.0, NOISE ) + ( neg_top_cap[0] + neg_bot_cap[0] ) * ( BULK - VCOMP );
  for(i=NCAPS;i>=1;i--)
  {
    switch (control[i])
    {
      case 0:         // sample input
        pos_Q = pos_Q + ( pos_top_cap[i] + pos_bot_cap[i] ) * ( Vinp - VCOMP );
        break;
      case 1:         // switch both to negative reference
        pos_Q = pos_Q + ( pos_top_cap[i] + pos_bot_cap[i] ) * ( VREFM - VCOMP );
        break;
      case 2:         // switch both to positive reference
        pos_Q = pos_Q + ( pos_top_cap[i] + pos_bot_cap[i] ) * ( VREFP - VCOMP );
        break;
      case 3:         // switch top to positive, bottom to negative
        pos_Q = pos_Q + ( pos_top_cap[i] ) * ( VREFP - VCOMP ) +
                        ( pos_bot_cap[i] ) * ( VREFM - VCOMP );
        break;
    }
    switch (control[i])
    {
      case 0:         // sample input
        neg_Q = neg_Q + ( neg_top_cap[i] + neg_bot_cap[i] ) * ( Vinn - VCOMP );
        break;
      case 1:         // switch both to positive reference
        neg_Q = neg_Q + ( neg_top_cap[i] + neg_bot_cap[i] ) * ( VREFP - VCOMP );
        break;
      case 2:         // switch both to negative reference
        neg_Q = neg_Q + ( neg_top_cap[i] + neg_bot_cap[i] ) * ( VREFM - VCOMP );
        break;
      case 3:         // switch top to positive, bottom to negative
        neg_Q = neg_Q + ( neg_top_cap[i] ) * ( VREFP - VCOMP ) +
                        ( neg_bot_cap[i] ) * ( VREFM - VCOMP );
        break;
    }
  }
}
/*
 * convert
 *   Compute the convener output
 */
long long convert( void )
{
  int i;
  int x;
  double pos_TQ,neg_TQ;
  long long data;
  // Compute the starting Q
  pos_TQ = ( pos_top_cap[0] + pos_bot_cap[0] ) * BULK; // parasitic caps are always to bulk
(ground)
  neg_TQ = ( neg_top_cap[0] + neg_bot_cap[0] ) * BULK;
  for(i=1;i<=NCAPS;i++)
  {
    switch ( control[i])
    {
      case 0:         // sample input
        printf("Can't cheek Vin in convert\n");
        break;
```

```
      case 1:           // switch both to negative reference
        pos_TQ = pos_TQ + ( pos_top_cap[i] + pos_bot_cap[i] ) * ( VREFM );
          break;
      case 2:           // switch both to positive reference
        pos_TQ = pos_TQ + ( pos_top_cap[i] + pos_bot_cap[i] ) * ( VREFP );
          break;
      case 3:           // switch top to positive, bottom to negative
          pos_TQ = pos_TQ + ( pos_top_cap[i] ) * ( VREFP ) +
                  ( pos_bot_cap[i] ) * ( VREFM );
          break;
    }
    switch (control[i])
    {
      case 0:           // sample input
      printf("Can't check Vin in convert\n");
        break;
      case 1:           // switch both to positive reference
      neg_TQ = neg_TQ + ( neg_top_cap[i] + neg_bot_cap[i] ) * ( VREFP );
        break;
      case 2:           // switch both to negative reference
      neg_TQ = neg_TQ + ( neg_top_cap[i] + neg_bot_cap[i] ) * ( VREFM );
        break;
      case 3:           // switch top to positive, bottom to negative
          neg_TQ = neg_TQ + ( neg_top_cap[i] ) * ( VREFP ) +
                  ( neg_bot_cap[i] ) * ( VREFM );
        break;
    }
  }
  // SAR the control ports, adjusting the Q on the fly
  data = offset;
  for(i=NCAPS;i>=0;i--)
  {
    if ( control[i] == 3 )
    {
    if ( pos_TQ - pos_Q > neg_TQ - neg_Q )
      {
        control[i] = 1;
        pos_TQ = pos_TQ - (( pos_top_cap[i] ) * ( VREFP ) + ( pos_bot_cap[i] ) *
( VREFM ));
      pos_TQ = pos_TQ + ( pos_top_cap[i] + pos_bot_cap[i] ) * ( VREFM );
        neg_TQ = neg_TQ - (( neg_top_cap[i] ) * ( VREFP ) + ( neg_bot_cap[i] ) *
( VREFM ));
      neg_TQ = neg_TQ + ( neg_top_cap[i] + neg_bot_cap[i] ) * ( VREFP );
      }
      else
      {
        control[i] = 2;
        pos_TQ = pos_TQ - (( pos_top_cap[i] ) * ( VREFP ) + ( pos_bot_cap[i] ) *
( VREFM ));
      pos_TQ = pos_TQ + ( pos_top_cap[i] + pos_bot_cap[i] ) * ( VREFP );
        neg_TQ = neg_TQ - (( neg_top_cap[i] ) * ( VREFP ) + ( neg_bot_cap[i] ) *
( VREFM ));
      neg_TQ = neg_TQ + ( neg_top_cap[i] + neg_bot_cap[i] ) * ( VREFM );
      }
    }
        if ( control[i] == 2 )
    data += weight[i];
        else
    data -= weight[i];
  }
  return data;
}
/*
 * normalize
 *      Make the sum of the weights equal to 2^NSCALE
 */
void normalize(void)
{
  int i;
  long long sum;
  sum = 0;
  for(i=NEXTRA+1;i<=NCAPS;i++)
        sum = sum + weight[i];
  for(i=0;i<=NCAPS;i++)
        weight[i] = ( weight[i] * ( 1LL << (NSCALE+1) ))/sum;
}
/*
 * init_weight( )
 *      Initialize the weight array
```

```
*/
void init_weight(void)
{
    int i;
    double wtmp[MAXCAPS];
    double sum;
    offset = 0;
    /* define radix 1.8 cap array */
    wtmp[0] = 0.5;// parasitic cap
    wtmp[1] = 1.0;
    for(i=2;i<=NCAPS;i++)
            wtmp[i] = pow(1.8,i-1);
    /* normalize */
    sum = 0;
    for(i=NEXTRA+1;i<=NCAPS;i++)
            sum += wtmp[i];
    for(i=0;i<=NCAPS;i++)
            wtmp[i] = (1LL << (NSCALE+1)) * wtmp[i]/sum;
    /* convert to fixed point */
    for(i=0;i<=NCAPS;i++)
            weight[i] = wtmp[i];
}
long long ErrAccum[MAXCAPS];
/*
 * calstep
 *      run a series of calibrations steps( load/force+/force-)
 */
void calstep( int hotseat, int count )
{
    int i,j,k;
    long long R1,R2,Error;
    int C1[MAXCAPS],C2[MAXCAPS];
    int Ctmp[MAXCAPS];
    int RanNum[MAXCAPS+1];
    int railerr,poserr,negerr;
    // Repeat for count loops
    for(j=0;j<count;j++)
    {
        railerr = 0;
        for(i=0;i<MAXCAPS+1;i=i++)
            RanNum[i] = ( random( ) & 1 ) + 1;
        // Create the DAC load value
        Ctmp[0] = 2;        // parasitic cap to ground (VREF-)
        for( i=1;i<=NCAPS;i=i++)
        {
      if ( i > hotseat )
          Ctmp[i] = RanNum[i];           // Randomly place sample within ADC range
      else if ( i == hotseat )
          Ctmp[i] = RanNum[i];           // Randomly place sample within ADC range
      else if ( i >= hotseat - 3 )
          Ctmp[i] = ( RanNum[hotseat] == 1 ) ? 2 : 1;       // Force code to overlap ( sample
voltage is +--+ or -+++- )
        else if ( i== hotseat - 4 )
            Ctmp[i] = RanNum[hotseat];
        else
            Ctmp[i] = RanNum[i];         // Randomize LSBs of sample voltage
        }
        // Sample load voltage
        for(i=0;i<=NCAPS;i++)
            control[i] = Ctmp[i];
        sample( 2.5,2.5 );               // parameter doesn't matter
        // Convert force1
        for(i=0;i<=NCAPS;i++)
        {
            if ( i > hotseat )
                control[i] = RanNum[i];
            else if ( i == hotseat )
                control[i] = RanNum[NCAPS+1]; // Randomly stan above or below final result
            else
                control[i] = 3;
        }
        R1 = convert( );
        // Save control word and check for errors
        poserr = 1;
        negerr = 1;
        for(i=0;i<=NCAPS;i++)
        {
            C1[i] = control[i];
            if ( C1[i] == 1 )
```

```
            poserr = 0;
        if ( C1[i] == 2 )
            negerr = 0;
    }
    if ( poserr | negerr )
        railerr = 1;
    // Convert force2
    for(i=0;i<=NCAPS;i++)
    {
        if ( i > hotseat )
            control[i] = RanNum[i];
        else if ( i == hotseat )
            control[i] = ( RanNum[NCAPS+1] == 1 ) ? 2 : 1;     // If we started above in force1
start below this time
        else
            control[i] = 3;
    }
    R2 = convert( );
    // Save control word
    poserr = 1;
    negerr = 1;
    for(i=0;i<=NCAPS;i++)
    {
        C2[i] = control[i];
        if ( C2[i] == 1 )
            poserr = 0;
        if ( C2[i] == 2 )
            negerr = 0;
    }
    if ( poserr | negerr )
        railerr = 1;
    // Update error accumulator if conversion wasn't in error (against positive or negative rail)
    if ( railerr == 0 )
    {
        Error = R1 - R2;
        for(i=0;i<=NCAPS;i++)
        {
            if (( C1[i] == 2 ) && ( C2[i] == 1 ))
                ErrAccum[i] = ErrAccum[i] + Error;
            else if (( C1[i] == 1 ) && ( C2[i] == 2 ))
                ErrAccum[i] = ErrAccum[i] - Error;
        }
    }
    else
    {
        printf("Rail error\n");
        j--;              // Don't count this conversion pair
    }
  }
}
void dnl_test(void)
{
    int i,j,k;
    int cnt;
    double vinp,vinn;
    long long data,last;
    long lfsr1,lfsr2;
double tmp;
{
    int imax,dmax;
    int imin,dmin;
    int less,more;
    int histogram[262144];
    double dnl,inl;
    double dnlmax,inlmax;
    double dnlmin,inlmin;
    double tmpavg,tmpcnt;
    less = more = 0;
    for(i=0;i<262144;i++)
        histogram[i] = 0;
    for(i=-131072*1023;i<=131072*1023;i++)
    {
        vinp = i * (( VREFP - VREFM )/(262144 * 1023)) + 2.5;
        vinn = -1 * i * (( VREFP - VREFM )/(262144 * 1023)) + 2.5;
        control[0] = 1; // parasitic cap is alway to ground
        for(j=1;j<=NEXTRA;j++)
            control[j] = 3;
        for(j=NEXTRA+1;j<= NCAPS;j++)
            control[j] = 0;
```

```
            sample( vinp, vinn );
            for(j=1;j<=NCAPS;j++)
                control[j] = 3;
            data = convert( );
            // Add in a triangle PDF before truncating to avoid truncation artifacts
            lfsr1 = random( ) & 0xF0;
            if ( lfsr1 & 0x80 ) lfsr1 |= 0xFFFFFF00;    // sign extend
            lfsr2 = random( ) & 0x78;
            if ( lfsr2 & 0x40 ) lfsr2 |= 0xFFFFFF80;    // sign extend
            data = data + lfsr1 + lfsr2;
            // truncate result
            data = data >> (NSCALE+1−17);
            // saturate result
            if ( data < −131072 )
                less++;
            else if ( data > 131071 )
                more++;
            else
                histogram[data+131072]++;
        }
        tmpavg = tmpcnt = 0;
        for(i=10;i<262134;i++)
        {
            tmpavg = tmpavg + histogram[i];
            tmpcnt = tmpcnt + 1;
        }
        tmpavg = tmpavg/tmpcnt;
        dnlmax = inlmax = 0;
        dnlmin = inlmin = 0;
        inl = 0;
        for(i=10;i<262134;i++)
                {
                    dnl = (histogram[i]/tmpavg) − 1;
                    if ( dnl > dnlmax )
                    {
                        dnlmax = dnl;
                        dmax = i −131072;
                    }
                    if ( dnl < dnlmin )
                    {
                        dnlmin = dnl;
                        dmin= i −131072;
                    }
                    inl = inl + dnl;
                    if ( inl > inlmax )
                    {
                        inlmax = inl;
                        imax = i −131072;
                    }
                    if ( inl < inlmin )
                    {
                        inlmin = inl;
                        imin = i −131072;
                    }
                }
            printf("DNL = %f @ %d, %f @ %d\t",dnlmax,dmax,dnlmin,dmin);
            printf("INL = %f @ %d, %f @ %d\n",inlmax,imax,inlmin,imin);
//          printf("less\t%d\n",less);
//          for(i=0;i<262144;i++)
//              printf("%d\t%d\n",i−131072,histogram[i]);
//          printf("more\t%d\n",more);
            fflush(stdout);
        }
    }
    int main(int argc, char *argv[ ])
    {
        int i,j,k;
        int cnt;
        long long tmp;
        NCAPS = 21;
        NEXTRA = −1;
        NSCALE = 24;
        for(i=1;i<argc;i++)
        {
            if ( strncmp( argv[i], "-caps=", 6 ) == 0)
                NCAPS = atol(&argv[i][6]);
            else if ( strncmp( argv[i], "-scale=", 7 ) == 0)
                NSCALE = atol(&argv[i][7]);
            else if ( strncmp( argv[i], "-extra=", 7 ) == 0)
```

```
                NEXTRA = atol(&argv[i][7]);
        else
            {
                printf("USAGE: sar -scale=<scale> -caps=<ncaps> -extra=<nextrat>\n");
                exit(0);
            }
    }
    if ( NEXTRA < 0 )
        NEXTRA = NCAPS - 11; // Sample on 11 caps
    // Initialization
    init_caps( );
    init_weights( );
for(j=0;j<=NCAPS;j++) printf("%lld\t",weight[j]); printf("\n"); fflush(stdout);
    // Calibration
#define PRECAL
#ifdef PRECAL
    for(i=8;i<=NCAPS;i++)
    {
        // Zero the error accumulator
        for(j=0;j<=NCAPS;j++)
            ErrAccum[j] = 0;
        calstep(i,64);
        tmp = ErrAccum[i]/128;
        if ( tmp < weight[i] )           // Don't allow weight to go negative
            weight[i] = weight[i] - tmp;
        for(j=0;j<=NCAPS;j++)
            printf("%lld\t",weight[j]);
        printf("\n");
        fflush(stdout);
    }
#endif
#define FULLCAL
#ifdef FULLCAL
    cnt = 4;
    for(i=0;i<511;i++)
    {
        if ( i >= 0 ) Mu = 256;
        if ( i >= 64 ) Mu = 256;
        if ( i >= 128 ) Mu = 512;
        if ( i >= 192 ) Mu = 512;
        if ( i >= 256 ) Mu = 512;
        if ( i >= 320 ) Mu = 512;
        if ( i >= 384 ) Mu = 512;
        if ( i >= 448 ) Mu = 1024;
        // Zero the error accumulator
        for(j=0;j<=NCAPS;j++)
            ErrAccum[j] = 0;
        // Run a single cal cycle
        calstep(NCAPS-3,cnt);
        calstep(NCAPS-2,cnt);
        calstep(NCAPS-1,cnt);
        calstep(NCAPS,cnt);
        // Update the weight vector
        for(j=0;j<NCAPS;j++)
        {
            tmp = ErrAccum[j]/Mu;
            if ( tmp < weight[j] )    // Don't allow weight to go negative
                weight[j] = weight[j] - tmp;
        }
        for(j=0;j<=NCAPS;j++)
            printf("%lld\t",weight[j]);
        printf("\n");
        fflush(stdout);
    }
    normalize( );
    for(j=0;j<=NCAPS;j++)
        printf("%lld\t",weight[j]);
    printf("\n");
    fflush(stdout);
#endif
#define OFFSET
#ifdef OFFSET
    tmp = 0;
    for(i=0;i<1024;i++)
    {
        control[0] = 1;        // parasitic cap is alway to ground
        for(j=1;j<=NEXTRA;j++)
            control[j] = 3;
        for(j=NEXTRA+1;j<=NCAPSj++)
```

```
        control[j] = 0;
     sample( 2.5, 2.5 );
     for(j=1;j<NCAPS;j++)
         control[j] = 3;
     control[NCAPS] = ( random( ) & 1 ) + 1;      // sometimes start above, sometimes below
     tmp = tmp + convert( );
  }
  tmp = tmp/1024;         // Average measurement
  offset = (1LL << (NSCALE+1−18)) − tmp;
  printf("%lld\n",offset);
#endif
  dnl_test( );
}
```

Following is one embodiment of a Mathematica® computer program that simulates the operation of at least one embodiment of the RNS ADC 200 and demonstrates an algorithm that generates weights in accordance with at least one embodiment of group calibration process 500, for the simulated operation of RNS ADC 200. The computer program can be used with Mathematic® software, available from Wolfram Research, Inc. having an office in Champaign, IL, or with Mathematica® compatible software programs such as MathReader or Publicon.:

```
(* Simulation of radix <2 conversion and associated calibration,
and noise effects*)
(* Assume 21 caps, therefore 20 ratios.
There will be 22 decisions made,
the last on the residue after the last conversion decision made.
        ratio of actual caps in conversion array *)
capratio = {1.8, 1.8, 1.8, 1.8, 1.8, 1.8, 1.8, 1.8, 1.8, 1.8, 1.7, 1.8, 1.8,
        1.8, 1.8, 1.7, 1.8, 1.8, 1.8, 1.8,};
caps = Table[1, {21}];
Do[caps[[i + 1]] = caps[[i]]/capratio[[i]], {i, 20}];
(* from the ratio, calculate values *)
caps /= caps.Join[Table[1, {11}], Table[0, {10}]];
(* convert does an actual conversion simulation. It assues that there is noise only in
the comparator. X is the analog input value, compnoise the rms comparison noise.
Returns a vector of + − 1*)
convert[x_, compnoise_] := Module[{r, y = { }, ng},
        r = x; ng = compnoise*Sqrt[3];
        Do[If[r + ng (Random[ ] + Random[ ] + Random[ ] + Random[ ] − 2) > 0,
                r −= caps[[i]]; y = {y, 1},
                r += caps[[i]]; y = {y, −1}],
                {i, 21}];
        If[r + ng (Random[ ] + Random[ ] + Random[ ] + Random[ ] − 2) > 0, y = {y, 1},
y = {y, −1}];
Flatten[y]
];
(*
fconvert does conversions where the first decisions are forced. This is used to choose
good patterns for calibration Force is the string of values to force *)
fconvert[x_, compnoise_, force_] := Module[{r, y = { }, ng},
        r = x; ng = compnoise*Sqrt[3];
        Do[
                If[i <= Length[force],
                y = {y, force[[i]]}; r −= force[[i]]*caps[[i]], (* when forced*)
                If[r + ng (Random[ ] + Random[ ] + Random[ ] + Random[ ] − 2) > 0,
                        r −= caps[[i]]; y = {y, 1},
                        r += caps[[i]]; y = {y, −1}]],
                {i, 21}];
                If[r + ng (Random[ ] + Random[ ] + Random[ ] + Random[ ] − 2) > 0, y = {y, 1},
y = {y, −1}];
Flatten[y]
];
(*
Calibrate the simulated converter. Uses a minimu set of favorite pattern pairs. First
pattern of each set forces c1 and c2 to be different in the top 2\bits. Second pattern of
each set forces difference to 2nd and 3rd bit. Third pattern of each set forces
difference to 3rd and 4th bit *)
docal2[ns_, count_] := Module[{x, c1, c2, t, w},
        t = { };
        Do[
                x = Join[{−1, 1, 1, 1}, Table[Random[Integer]*2 − 1, {17}]].caps;
                c1 = fconvert[x, ns, {1}];
                c2 = fconvert[x, ns, {−1}];
```

```
              t = {t, c1 - c2};
              x = Join[{1, -1, 1, 1, 1}, Table[Random[Integer]*2 - 1, {16}]].caps;
              c1 = fconvert[x, ns, {1, 1}];
              c2 = fconvert[x, ns, {1, -1}];
              t = {t, c1 - c2};
              x =
              Join[{1, 1, -1, 1, 1, 1}, Table[Random[Integer]*2 - 1, {15}]].caps;
              c1 = fconvert[x, ns, {1, 1, 1}];
              c2 = fconvert[x, ns, {1, 1, -1}];
              t = {t, c1 - c2};
              , {count}];
              t = Partition[Flatten[t], 22];
              t = Transpose[t];
       (*
       t is now the collection of c1 - c2 sets. Want the best weight vector that minimizes
       the sum of (w.(c1 - c2)) for all trials, but not the case of w = 0. Will force the leading
       value of w to 1, and normalize latter. w is 22 long, so a solution of 21 linear equations
       is obtained. Use matrix math for a direct solution*)
              c1 = Table[
                   Table[t[[i]].t[[j]] // N, {i, 2, 22}],
                   {j, 2, 22}];
              c2 = Table[-t[[i]].t[[1]], {i, 2, 22}];
              w = Prepend[LinearSolve[c1, c2], 1];
              (*now mormalize. Make the top 11 weights sum to 1*) w//(w.Join[Table[1,
       {11}], Table[0, {11}]])
       ];
       wtest = docal2[.3*2^-17, 1000]
       \!\({0.44513703794020276', 0.24729837870664242', 0.13738799430801993',
       0.07632663779594223', 0.042403740622601944', 0.023557614364877074',
       0.013087550376030236', 0.007270860072676516', 0.004039312150620152',
       0.002244116602096164', 0.0012497570602905439', 0.0007334448345613402',
       0.0004074964094076198', 0.00022263554255691507', 0.000125698785142635',
       0.00006975329760644579', 0.00004091903655050883', 0.0000225098655812323',
       0.00001228565285254356l', 6.474096519568135'*^-6,
       3.3750160215606014'*^-6, 1.7439540754242361'*^-6}\)
       (* Test out some conersions *)
       Print[wtest.convert[.123, .3*2^-17]];
       Print[wtest.convert[.456, .3*2^-17]];
       Print[wtest.convert[-.5, .3*2^-17]];
       Print[wtest.convert[10^-4, .3*2^-17]];
       0.123001
       0.456001
       -0.499999
       0.0000957819
```

Although the present invention has been described in detail, it should be understood that various changes, substitutions and alterations can be made hereto without departing from the spirit and scope of the invention as defined by the appended claims. For example, the value of the gain μ can be adaptively changed, faster when large, more accurate when small.

What is claimed is:

1. A method of calibrating a redundant number system analog-to-digital converter (RNS ADC), wherein the RNS ADC includes N analog converter reference elements, each of the analog converter reference elements is associated with a weight in a weight vector, and N is an integer greater than one, the method comprising:

successively approximating each of M distinct analog input signals twice to generate M respective pairs of successive approximation converter reference element vectors, that correspond to digital approximations of the input signals, wherein M is a positive integer; and using differences between converter reference element vectors of each of the M respective pairs to determine a final weight vector.

2. The method of claim 1 wherein using differences between converter reference element vectors of each of the M respective pairs to determine a final weight vector further comprises:

using differences between converter reference element vectors of each of the M respective pairs to determine a final weight vector $\overline{M}_B$ that minimizes an error between the differences between converter reference element vectors.

3. The method of claim 1 wherein using differences between converter reference element vectors of each of the M respective pairs to determine a final weight vector further comprises:

using differences between converter reference element vectors of each of the M respective pairs to determine a final weight vector $\overline{W}_B$ such that:

$$\frac{1}{M} \sum_{j=0}^{M-1} [(\overline{C}_{1j} - \overline{C}_{2j}) \Box \overline{W}_B]^2 \le TH$$

wherein TH is a threshold value.

4. The method of claim 1 wherein using differences between converter reference element vectors of each of the M respective pairs to determine a final weight vector further comprises:

iteratively determining the final weight vector $\overline{W}_B$, wherein each iteration adjusts the weight vector $\overline{W}$ towards the final weight vector $\overline{W}_B$.

5. The method of claim 4 wherein iteratively determining the final weight vector $\overline{W}_B$ further comprises:
   determining each iteration of the final weight vector $\overline{W}_B$ using groups of successive approximation reference vectors.

6. The method of claim 5 wherein using differences between converter reference element vectors of each of the M respective pairs to determine a final weight vector $\overline{W}_B$ further comprises:
   determining a weight vector $\overline{W}_0$ such that:

$$\frac{1}{M_0}\sum_{j=0}^{M_0-1}[(\overline{C}_{1j}-\overline{C}_{2j})\square\overline{W}_0]^2 \le TH_0;$$

for all i={1, 2, . . . , Y−1}, using weight vector $\overline{W}_{i-1}$ to determine a weight vector $\overline{W}_i$ such that:

$$\frac{1}{B-A+1}\left[\sum_{j=A}^{B}[(\overline{C}_{1j}-\overline{C}_{2j})\square\overline{W}_i]^2\right] \le TH_i;$$

wherein $$A = \sum_{k=0}^{i-1} M_k,\ B = \left(\sum_{k=0}^{i} M_k\right) - 1,\ M_0, M_1, \ldots, M_{Y-1}$$

each represent a number of pairs of distinct conversions, Y represents a number of groups of pairs of distinct conversions, Y is an integer greater than 0, $$M = \sum_{i=0}^{Y-1} M_i,\ \text{each } TH_i \text{ for all } i = \{0, 1, 2, \ldots, Y-1\}$$

is a respective threshold value, and i is an integer greater than zero.

7. The method of claim 6 wherein:
determining a weight vector $\overline{W}_0$ such that $$\frac{1}{M_0}\sum_{j=0}^{M_0-1}[(\overline{C}_{1j}-\overline{C}_{2j})\cdot\overline{W}_0]^2 \le TH_0$$

comprises:
determining an error $e_0$, wherein:

$$e_0 = \frac{1}{M_0}\sum_{j=0}^{M_0-1}[(\overline{C}_{1j}-\overline{C}_{2j})\square\overline{W}_{init}]^2;\text{ and}$$

determining the weight vector $\overline{W}_0$, wherein:

$$\overline{W}_0 = \overline{W}_{init} - \frac{1}{M_0}\sum_{j=0}^{M_0-1}[(\overline{C}_{1j}-\overline{C}_{2j})\square e_0\square\mu];\text{ and}$$

for all i={1, 2, . . . , Y−1}, using weight vector $\overline{W}_{i-1}$ to determine a weight vector $\overline{W}_i$ such that $$\frac{1}{B-A+1}\sum_{j=A}^{B}[(\overline{C}_{1j}-\overline{C}_{2j})\square\overline{W}_i]^2 \le TH_i$$

comprises:
for all i={1, 2, . . . , Y−1}, determining an error $e_i$, wherein:

$$e_i = \frac{1}{(B-A+1)}\sum_{j=A}^{B}[(\overline{C}_{1j}-\overline{C}_{2j})\square\overline{W}_i];\text{ and}$$

determining $\overline{W}_i$, wherein:

$$\overline{W}_i = \overline{W}_{i-1} - \frac{1}{(B-A+1)}\sum_{j=A}^{B}[(\overline{C}_{1j}-\overline{C}_{2j})\square e_i\square\mu]$$

wherein $\overline{W}_{init}$ is an initial weight vector and $\mu$ is a gain.

8. The method of claim 7 further comprising increasing a rate of convergence of the error $e_i$ to within a predetermined threshold.

9. The method of claim 7 wherein $\mu$ is a vector $\overline{\mu}$, and element values of the vector $\overline{\mu}$ have a decreasing step size so that an element modifying a more significant bit of $$\left[\frac{1}{(B-A+1)}\sum_{j=A}^{B}(\overline{C}_{1j}-\overline{C}_{2j})\right]$$

is larger than an element modifying a lesser significant bit.

10. The method of claim 7 wherein the weight vector is normalized to set a largest weight equal to a fixed value and all remaining weights to a fraction of the largest weight.

11. The method of claim 10 wherein a sum of the N weights of the weight vector equals the fixed value.

12. The method of claim 4 wherein iteratively determining the final weight vector $\overline{W}_B$ further comprises:
   determining each iteration of the final weight vector $\overline{W}_B$ using individual pairs of successive approximation reference vectors.

13. The method of claim 12 wherein using differences between converter reference element vectors of each of the M respective pairs to determine a final weight vector $\overline{W}_B$ further comprises:
   determining an error $e_0$ and a weight vector $\overline{W}_0$, wherein:

$$e_0 = [(\overline{C}_{1_0}-\overline{C}_{2_0})\square\overline{W}_{init}]^2;\text{ and}$$

$$\overline{W}_0 = \overline{W}_{init} - (\overline{C}_{1_0}-\overline{C}_{2_0})\square e_0\square\mu;\text{ and}$$

for all i={1, 2, . . . , M−1}, determining an error $e_i$ and a weight vector $\overline{W}_i$, wherein:

$$e_i = [(\overline{C}_{1_i} - \overline{C}_{2_i}) \square \overline{W}_i]^2; \text{ and}$$

$$\overline{W}_i = \overline{W}_{i-1} - (\overline{C}_{1_i} - \overline{C}_{2_i}) \square e_i \square \mu$$

wherein the final weight vector $\overline{W}_B = \overline{W}_{M-1}$, $\overline{W}_{init}$ is an initial weight vector, and $\mu$ is a gain.

14. The method of claim 13 further comprising increasing a rate of convergence of the weight vector $\overline{W}_i$ to the final weight vector $\overline{W}_B$.

15. The method of claim 13 wherein $\mu$ is a vector $\overline{\mu}$, and element values of the vector $\overline{\mu}$ have a decreasing step size so that an element modifying a more significant bit of $\overline{C}_{1_j} - \overline{C}_{2_j}$ is larger than an element modifying a lesser significant bit.

16. The method of claim 13 wherein the weight vector $\overline{W}_i$ is normalized to set a largest weight equal to a fixed value and all remaining weights to a fraction of the largest weight.

17. The method of claim 16 wherein a sum of the N weights of the weight vector $\overline{W}_i$ equals the fixed value.

18. The method of claim 1 further comprising:
selecting each of input signals so that a value of each of the input signals resides within a conversion overlap region of the RNS ADC.

19. The method of claim 1 wherein each of successive approximation reference vectors, for all j ∈ {0, 1, . . . , M−1}, is a binary vector of length N, the method further comprising:
forcing x most significant bit(s) of successive approximation reference vectors $\overline{C}_{1_j}$ and $\overline{C}_{2_j}$ to distinct values within a conversion overlap region, wherein x is an integer greater than or equal to one.

20. The method of claim 19 wherein each of successive approximation reference vectors $\overline{C}_j$ and $\overline{C}_k$, for all j ∈ {0, 1, . . . , M−1}, is a binary vector of length N, the method further comprising:
forcing y least significant bit(s) of successive approximation reference vectors $\overline{C}_{1_j}$ and $\overline{C}_{2_j}$ to remain constant until x most significant bits of the final weight vector are determined.

21. The method of claim 19 wherein x equals the number of most significant bits of successive approximation reference vectors $\overline{C}_{1_j}$ and $\overline{C}_{2_j}$ whose respective values can cause successive approximation reference vector $\overline{C}_{1_j}$ to not equal successive approximation reference vector $\overline{C}_{2_j}$.

22. The method of claim 1 wherein each converter reference element vector includes N-elements and each of the N-elements is associated with a respective one of the analog converter reference elements.

23. The method of claim 1 wherein using differences between converter reference element vectors of each of the M respective pairs to determine a final weight vector further comprises:
determining one or more intermediate weight vectors in successive order, wherein determination of a first intermediate weight vector depends upon an initial weight vector and determination of each subsequent intermediate weight vector depends upon a prior determined intermediate weight vector; and
determining the final weight vector from the intermediate weight vector determined last.

24. The method of claim 1 wherein each of the analog converter reference elements differ successively by less than a factor of 2.

25. The method of claim 1 wherein at least a subset of the analog converter reference elements differ successively by less than a factor of 2.

26. The method of claim 1 wherein the N analog converter reference elements of the RNS ADC comprise resistors in a resistor array used to generated an analog signal to compare to the input signal, and the weight elements of the weight vector represent estimated values of the resistors in the resistor array.

27. The method of claim 1 wherein the N analog converter reference elements of the RNS ADC comprise capacitors in a capacitor array used to generated an analog signal to compare to the input signal, and the weight elements of the weight vector represent estimated values of the capacitors in the capacitor array.

28. A method of calibrating a redundant number system, analog-to-digital converter, the method comprising:
selecting an input voltage;
converting the input voltage into a first conversion;
forcing conversion of the input voltage into a second conversion, wherein the first conversion is different than the second conversion; and
calibrating the redundant number system, analog-to-digital converter using the first and second conversions.

29. A redundant number system, analog-to-digital converter comprising:
an input to receive an input voltage;
a converter to convert the input voltage into a first conversion and to force conversion of the input voltage into a second conversion, wherein the first conversion is different than the second conversion; and
a calibrator to calibrate the redundant number system, analog-to-digital converter using the first and second conversions.

30. A redundant number system, analog-to-digital converter comprising:
an input to receive an input signal;
N analog converter reference elements, coupled to the input, wherein each of the analog converter reference elements is associated with a weight in a weight vector, and N is an integer greater than one;
conversion logic, coupled to the analog converter reference elements, to successively approximate each of M distinct analog input signals twice to generate M respective pairs of successive approximation converter reference element vectors that correspond to digital approximations of the input signals, wherein M is a positive integer; and
calibration logic, coupled to the conversion logic to use differences between converter reference element vectors of each of the M respective pairs to determine a final weight vector.

31. The redundant number system, analog-to-digital converter of claim 30 wherein the calibration logic is further configured to use differences between converter reference element vectors of each of the M respective pairs to determine a final weight vector $\overline{W}_B$ that minimizes an error between the differences between converter reference element vectors.

32. The redundant number system, analog-to-digital converter of claim 30 wherein the calibration logic is further configured to use differences between converter reference element vectors of each of the M respective pairs to determine a final weight vector such that:

$$\frac{1}{M}\sum_{j=0}^{M-1}[(\overline{C}_{1j}-\overline{C}_{2j})\Box\overline{W}_B]^2 \le TH$$

wherein TH is a threshold value.

33. The redundant number system, analog-to-digital converter of claim 30 wherein the calibration logic is further configured to iteratively determine the final weight vector, wherein each iteration adjusts the weight vector towards the final weight vector.

34. The redundant number system, analog-to-digital converter of claim 33 wherein the calibration logic is further configured to determine each iteration of the final weight vector using groups of successive approximation reference vectors.

35. The redundant number system, analog-to-digital converter of claim 34 wherein the calibration logic is further configured to:

determine a weight vector $\overline{W}_0$ such that:

$$\frac{1}{M_0}\sum_{j=0}^{M_0-1}[(\overline{C}_{1j}-\overline{C}_{2j})\Box\overline{W}_0]^2 \le TH_0; \text{ and}$$

for all i={1, 2, . . . , Y−1}, use weight vector $\overline{W}_{i-1}$ to determine a weight vector $\overline{W}_i$ such that:

$$\frac{1}{B-A+1}\left[\sum_{j=A}^{B}[(\overline{C}_{1j}-\overline{C}_{2j})\Box\overline{W}_i]^2\right] \le TH_i;$$

wherein $$A = \sum_{k=0}^{i-1} M_k, B = \left(\sum_{k=0}^{i} M_k\right) - 1, M_0, M_1, \ldots, M_{Y-1}$$

each represent a number of pairs of distinct conversions, Y represents a number of groups of pairs of distinct conversions, Y is an integer greater than 0, $$M = \sum_{i=0}^{Y-1} M_i,$$

each $TH_i$ for all i={0, 1, 2, . . . , Y−1} is a respective threshold value, and i is an integer greater than zero.

36. The redundant number system, analog-to-digital converter of claim 35 wherein the calibration logic is further configured to:

determine an error $e_0$, wherein:

$$e_0 = \frac{1}{M_0}\sum_{j=0}^{M_0-1}[(\overline{C}_{1j}-\overline{C}_{2j})\Box\overline{W}_{init}]^2; \text{ and}$$

determine the weight vector $\overline{W}_0$, wherein:

$$\overline{W}_0 = \overline{W}_{init} - \frac{1}{M_0}\sum_{j=0}^{M_0-1}[(\overline{C}_{1j}-\overline{C}_{2j})\Box e_0\Box\mu]; \text{ and}$$

for all i={1, 2, . . . , Y−1}, determine an error $e_i$, wherein:

$$e_i = \frac{1}{(B-A+1)}\sum_{j=A}^{B}[(\overline{C}_{1j}-\overline{C}_{2j})\Box\overline{W}_i]; \text{ and}$$

determine $\overline{W}_i$, wherein:

$$\overline{W}_i = \overline{W}_{i-1} - \frac{1}{(B-A+1)}\sum_{j=A}^{B}[(\overline{C}_{1j}-\overline{C}_{2j})\Box e_i\Box\mu]$$

wherein $\overline{W}_{init}$ is an initial weight vector and μ is a gain.

37. The redundant number system, analog-to-digital converter of claim 36 wherein the conversion logic is further configured to increasing a rate of convergence of the error $e_i$ to within a predetermined threshold.

38. The redundant number system, analog-to-digital converter of claim 36 wherein μ is a vector $\overline{\mu}$, and element values of the vector $\overline{\mu}$ have a decreasing step size so that an element modifying a more significant bit of $$\left[\frac{1}{(B-A+1)}\sum_{j=A}^{B}(\overline{C}_{1j}-\overline{C}_{2j})\right]$$

is larger than an element modifying a lesser significant bit.

39. The redundant number system, analog-to-digital converter of claim 36 wherein the weight vector is normalized to set a largest weight equal to a fixed value and all remaining weights to a fraction of the largest weight.

40. The redundant number system, analog-to-digital converter of claim 39 wherein a sum of the N weights of the weight vector equals the fixed value.

41. The redundant number system, analog-to-digital converter of claim 33 wherein the calibration logic is further configured to determine each iteration of the final weight vector using individual pairs of successive approximation reference vectors.

42. The redundant number system, analog-to-digital converter of claim 41 wherein the calibration logic is further configured to:

determine an error $e_0$ and a weight vector $\overline{W}_0$, wherein:

$$e_0 = [(\overline{C}_{1_0}-\overline{C}_{2_0})\Box\overline{W}_{init}]^2; \text{ and}$$
$$\overline{W}_0 = \overline{W}_{init} - (\overline{C}_{1_0}-\overline{C}_{2_0})\Box e_0\Box\mu; \text{ and}$$

for all i={1, 2, . . . , M−1}, determine an error $e_i$ and a weight vector $\overline{W}_i$, wherein:

$$e_i = [(\overline{C}_{1_i} - \overline{C}_{2_i}) \square \overline{W}_i]^2; \text{ and}$$

$$\overline{W}_i = \overline{W}_{i-1} - (\overline{C}_{1_i} - \overline{C}_{2_i}) \square e_i \square \mu$$

wherein the final weight vector $\overline{W}_B = \overline{W}_{M-1}$, $\overline{W}_{init}$ is an initial weight vector, and $\mu$ is a gain.

43. The redundant number system, analog-to-digital converter of claim 42 wherein the conversion logic is further configured to increase a rate of convergence of the weight vector $\overline{W}_i$.

44. The redundant number system, analog-to-digital converter of claim 42 wherein $\mu$ is a vector $\overline{\mu}$, and element values of the vector $\overline{\mu}$ have a decreasing step size so that an element modifying a more significant bit of $\overline{C}_{1_j} - \overline{C}_{2_j}$ is larger than an element modifying a lesser significant bit.

45. The redundant number system, analog-to-digital converter of claim 42 wherein the weight vector $\overline{W}_i$ is normalized to set a largest weight equal to a fixed value and all remaining weights to a fraction of the largest weight.

46. The redundant number system, analog-to-digital converter of claim 45 wherein a sum of the N weights of the weight vector $\overline{W}_i$ equals the fixed value.

47. The redundant number system, analog-to-digital converter of claim 30 wherein the calibration logic is further configured to select each of input signals so that a value of each of the input signals resides within a conversion overlap region of the RNS ADC.

48. The redundant number system, analog-to-digital converter of claim 30 wherein each of successive approximation reference vectors, $\overline{C}_{1_j}$ and $\overline{C}_{2_j}$, for all $j \in \{0, 1, \ldots, M-1\}$, is a binary vector of length N, and the conversion logic is further configured to force x most significant bit(s) of successive approximation reference vectors $\overline{C}_{1_j}$ and $\overline{C}_{2_j}$ to distinct values within a conversion overlap region, wherein x is an integer greater than or equal to one.

49. The redundant number system, analog-to-digital converter of claim 48 wherein each of successive approximation reference vectors, $\overline{C}_{1_j}$ and $\overline{C}_{2_j}$, for all $j \in \{0, 1, \ldots, M-1\}$, is a binary vector of length N, and the conversion logic is further configured to force y least significant bit(s) of successive approximation reference vectors $\overline{C}_{1_j}$ and $\overline{C}_{2_j}$ to remain constant until x most significant bits of final weight vector $\overline{W}_B$ are determined.

50. The redundant number system, analog-to-digital converter of claim 48 wherein x equals the number of most significant bits of successive approximation reference vectors $\overline{C}_{1_j}$ and $\overline{C}_{2_j}$ whose respective values can cause successive approximation reference vector $\overline{C}_{1_j}$ to not equal successive approximation reference vector $\overline{C}_{2_j}$.

51. The redundant number system, analog-to-digital converter of claim 30 wherein each converter reference element vector includes N-elements and each of the N-elements is associated with a respective one of the analog converter reference elements.

52. The redundant number system, analog-to-digital converter of claim 30 wherein the calibration logic is further configured to
determine one or more intermediate weight vectors in successive order, wherein determination of a first intermediate weight vector depends upon an initial weight vector and determination of each subsequent intermediate weight vector depends upon a prior determined intermediate weight vector; and
determine the final weight vector from the intermediate weight vector determined last.

53. The redundant number system, analog-to-digital converter of claim 30 wherein each of the analog converter reference elements differ successively by less than a factor of 2.

54. The redundant number system, analog-to-digital converter of claim 30 wherein at least a subset of the analog converter reference elements differ successively by less than a factor of 2.

55. The redundant number system, analog-to-digital converter of claim 30 wherein the N analog converter reference elements of the RNS ADC comprise resistors in a resistor array used to generated an analog signal to compare to the input signal, and the weight elements of the weight vector represent estimated values of the resistors in the resistor array.

56. The redundant number system, analog-to-digital converter of claim 30 wherein the N analog converter reference elements of the RNS ADC comprise capacitors in a capacitor array used to generated an analog signal to compare to the input signal, and the weight elements of the weight vector represent estimated values of the capacitors in the capacitor array.

57. A signal processing system comprising:
a redundant number system successive approximation register (RNS ADC), wherein the RNS ADC comprises:
a digital-to-analog converter, wherein the digital-to-analog converter includes N analog converter reference elements, each of the analog converter reference elements is represented as a weight in a weight vector, and N is an integer greater than one;
an input to receive a test analog input signal, wherein the analog input signal has a corresponding digital value within a conversion overlap region of the RNS ADC;
a comparator, coupled to the input and digital-to-analog converter to generate a comparison signal;
conversion logic, coupled to the analog reference signal generator, to receive the comparison signal and to cause the digital-to-analog converter to successively approximate each of M distinct analog input signals twice to generate M respective pairs of successive approximation converter reference element vectors that correspond to digital approximations of the input signals, wherein M is a positive integer; and
calibration logic, coupled to the conversion logic, to use differences between converter reference element vectors of each of the M respective pairs to determine a final weight vector.

58. An apparatus to calibrate a redundant number system successive approximation register (RNS ADC), wherein the RNS ADC includes N analog converter reference elements, each of the analog converter reference elements is represented as a weight in a weight vector and N is an integer greater than one, the apparatus comprising:
means for successively approximating each of M distinct analog input signals twice to generate M respective pairs of successive approximation converter reference element vectors that correspond to digital approximations of the input signals wherein M is a positive integer; and
means for using differences between converter reference element vectors of each of the M respective pairs to determine a final weight vector.

* * * * *